(12) United States Patent
Lee et al.

(10) Patent No.: US 6,775,901 B1
(45) Date of Patent: Aug. 17, 2004

(54) BONDING WIRE INDUCTOR

(75) Inventors: Hai Young Lee, 314-304, Imkwang Apt., Seohyun-dong, Bundang-gu, Seongnam-city, Kyungki-do (KR); Yong Goo Lee, Seoul (KR)

(73) Assignee: Hai Young Lee, Soengnam (KR)

( * ) Notice: Subject to any disclaimer, the term of this patent is extended or adjusted under 35 U.S.C. 154(b) by 0 days.

(21) Appl. No.: 09/762,903
(22) PCT Filed: Aug. 14, 1999
(86) PCT No.: PCT/KR99/00451
§ 371 (c)(1), (2), (4) Date: Feb. 14, 2001
(87) PCT Pub. No.: WO00/10179
PCT Pub. Date: Feb. 24, 2000

(30) Foreign Application Priority Data

| Aug. 14, 1998 | (KR) | 98-33548 |
| Oct. 16, 1998 | (KR) | 98-43771 |
| Dec. 4, 1998 | (KR) | 98-53563 |

(51) Int. Cl.$^7$ .................................. H01F 7/06
(52) U.S. Cl. ............................. 29/602.1; 366/200
(58) Field of Search ............................. 29/602.1, 605, 29/606; 336/200, 183, 186, 205, 208, 199; 427/116

(56) References Cited

U.S. PATENT DOCUMENTS

| 3,614,554 A | * | 10/1971 | Shield et al. | 257/531 |
| 4,777,465 A | * | 10/1988 | Meinel | 29/606 |
| 5,425,167 A | * | 6/1995 | Shiga et al. | 29/602.1 |
| 5,543,773 A | * | 8/1996 | Evans et al. | 336/183 |
| 5,767,563 A | * | 6/1998 | Imam et al. | 257/531 |
| 5,805,431 A | * | 9/1998 | Joshi et al. | 361/836 |
| 6,194,774 B1 | * | 2/2001 | Cheon | 257/531 |
| 6,429,764 B1 | * | 8/2002 | Karam et al. | 336/200 |

FOREIGN PATENT DOCUMENTS

| EP | 0515821 | 12/1992 |
| JP | 08-162329 | 6/1996 |
| JP | 09-106915 | 4/1997 |
| JP | 10-74625 | * 3/1998 |

OTHER PUBLICATIONS

2 Notices Of The Reasons of Rejections.
Micromachined Intermediate and High Frequency Inductors; Jun. 9–12, 1997; announced in IEEE International Symposium On Circuits and Systems.

* cited by examiner

Primary Examiner—Timothy L. Maust
Assistant Examiner—Huyen Le
(74) Attorney, Agent, or Firm—Staas & Halsey LLP

(57) ABSTRACT

A vertical bonding wire inductor having a high quality (Q) factor and tunability, which can be manufactured using an existing wire bonding technology which is widely used for packaging integrated circuits, without an additional mask manufacturing process. The vertical bonding wire inductor includes at least one pair of bonding pads (3) occupying a predetermined area on a substrate (9) and one or more bonding wires (1) for connecting one or more pairs of bonding pads (3). The bonding wire (1) has a loop shape having a predetermined height. Due to the improved electrical characteristics, stability in process, tunability without an additional mask manufacturing process, and relatively low manufacturing cost, the vertical bonding wire inductor can be useful in production of economical microwaves devices.

17 Claims, 31 Drawing Sheets

BONDING WIRE INDUCTOR

TECHNICAL FIELD

The present invention relates to inductors, and more particularly, to an inductor used in integrated, circuits (ICs).

BACKGROUND ART

As the importance of communications services increases in modem information societies, high-speed, high-performance, highensity, high-reliability and low-cost electric devices are also required for a high quality, wide bandwidth, high data rate communication service, in addition to increasing the capability and speed of a channel. Thus, improving the structure and performance of radio frequency ICs (RFICs) and microwave monolithic ICs (MMICs) and hybrid ICs becomes the center of interest in the related art. In particular, improvement in the performance of an inductor which is a basic element used in designing voltage-controlled oscillators (VCOs), low noise amplifiers (INAs), narrow-ban impedance matching networks, high-performance linear filters, single-chip transceivers, multi-chip modules (MCMs) and low voltage/low power devices, which are key technologies in wireless communications, is very important. The performance of an inductor used for such RFICs and MMICs is evaluated according to Q-factor, inductance and self-resonant frequency, and typically an inductor having a high Q-factor is required in the technical field relating to the present invention [Seung-won Pack and Kwang-seok Seo, 1997, *Air-Gap Stacked Spiral Inductor*, IEEE Microwave and Guided Wave Letters, Vol. 7, No. 10, pp. 329–331].

Until now, horizontal spiral inductors have been used in RFICs and MMICs. However, the horizontal spiral inductor has disadvantages in that a relatively large area is occupied by the inductor with respect to the entire area of the RFIC or MMIC, and its Q-factor is low due to inevitable ohmic loss and dielectric loss. Also, due to an air-bridge process for connecting the center of the spiral inductor to a port, an additional photolithography and metallization processes are required in manufacturing the spiral inductor. Because of these problems, it is difficult to manufacture such a conventional spiral inductor. Also, after the manufacture of a mask used for the manufacture of the spiral inductor is completed, the inductance of an inductor manufactured thereby is fixed. Thus, in order to obtain different inductances, a separate mask must be manufactured for each conductor, thus increasing the manufacturing cost.

To solve the above problems, S. Chaki et al. suggests a method for increasing the Q-factor of an inductor by lowering resistance by increasing the thickness or width of a stripline formed by gold (Au) [S.Chaki, S. Aono, N. Andoh, Y. Sasaki, N. Tanini and O. Ishihara, 1995, *Experimental Study on Spiral Induaors*, IEEE MTTs Digest, pp. 735–756; M. Hirano, Y. Imai and K. Asai, 1991, ¼ *Miniaturized Passive Elements for GaAs MMICs*, Proc. Of IEEE GaAs IC Symposium]. However, increasing the thickness of the stripline inevitably increases the unit cost of production, makes air-bridge processing for connecting the center of the inductor to a port difficult, increases the area occupied by the inductor in the RFIC or MMIC, and thus it is not suitable for low-cost mass production.

I. Woff and H. Kapusta disclose another method for solving the above problems by increasing inductance by increasing the length of a stripline. According to this method, however, the width of the stripline of a spiral inductor and the interval between the striplines become narrow, so that the resistance of the stripline increases and the Q-factor decreases. Thus, in order to increase inductance without a decrease in Q-factor, the area occupied by the spiral inductor must increase, thus increasing the manufacturing cost. Also, due to the loss of capacitance between a ground plane and the stripline and dielectric loss in a substrate, self-resonant frequency is liable to decrease [I. Wolf and H. Kapusta, 1987, *Modeling of Circular Spiral Inductors for MMJCs*, IEEE MITs Digest, pp. 123–126].

Also, Y. Seo et al. suggests using a multi-layered inductor as another method for increasing inductance [Y. Seo and V. Tripathi, 1995, *Spiral Inductor in RFIC's and MMICS*, Proc. of Asia Pacific Microwave Conference, pp. 454–457; L. Zu and Y. Lu et al., 1996, *High Q-factor Inductors Integrated on MCM Si Substrates*, IEEE Trans. on Components, Packaging, and Manufacturing Tech. Part B, Vol. 19, No. 3, pp. 635–642]. Also, Y. Sun et al. reports an air-bridge inductor in which a wire is suspended from a dielectric substrate, as a method for decreasing conductance due to the capacitance and dielectric loss [Y. Sun, H. V. Zeiji, J. L. Tauritz and R. G. f. Baets, 1996, *Suspended Membrane Inductors and Capacitors for Application in Silicon MMIC's*, IEEE Microwave and Millimeter-Wave Monolithic Circuits Symposium Digest, pp. 99–102; C. Y. Chii and G. M. Rebeiz, 1995, *Planar Microwave and Millmeer-Wave Lumped Elements and Coupled-Line Filters Using Micro-Machining Techniques*, IEEE Trans. on Microwave Theory and Tech., Vol. 43, No. 4, pp. 730–738]. However, these methods require a great expense for production, thus practical use thereof is difficult.

DISCLOSURE OF THE INVENTION

An object of the present invention is to improve the performance and economical problems of a conventional spiral inductor, and in particular, to improve a low quality (Q) factor and a low self-resonant frequency of the spiral inductor and difficulty in manufacturing the inductor;

Another object of the present invention is to provide a bonding wire inductor using a wire bonding technology which is widely used for integrated circuit packaging.

Another object of the present invention is to provide an on-chip solenoidal bonding wire inductor fabricated by a semiconductor manufacturing process.

Another object of the present invention is to provide a coupler or transformer using two bonding wire inductors arranged adjacent to each other.

Another object, of the present invention is to provide a surface mounted-type bonding wire inductor for a hybrid integrated circuits.

Another object of the present invention is to provide a vertical bonding wire inductor having, high Q-factor, high self-resonant frequency, and tunability which does not need an additional mask manufacturing process.

To achieve the above objects of the present invention, there are provided a bonding wire inductor having at least one pair of bonding pads which face each other, occupying a predetermined area on a substrate, wherein the facing bonding pads are connected by a bonding wire which is suspended from the substrate, thus forming a loop.

A pair of bonding pads and one bonding wire form a single loop bonding wire inductor. However, a bonding, wire inductor having 2, 3 or more loops can be manufactured as desired, and such a multiple bonding wire inductor falls within the scope of the present invention. In the case of a multi-loop bonding wire inductor, multiple bonding wires are arranged at a predetermined interval according to a pad pitch. As the pad pitch becomes narrow, the structure of the inductor becomes similar to that of a coil, increasing inductance. In the case of including two or more pairs of bonding pads, such bonding pads are arranged in two rows on a substrate. Also, a parallel connection between each of the bonding pads of one of the two rows and the bonding pad of the other row, the pads facing each other, and a diagonal connection between each of the bonding pads of one row and the corresponding bonding pad adjacent to the facing bonding pad of the other row, can be both connected by bonding wires as mentioned above, or the parallel or diagonal connection can be made by a metal strip which is in contact with the substrate.

Also, the bonding wire and bonding pads are ball-wedge bonded by automatic fine pitch ball bonding. Alternatively, the connection between the bonding wire and the bonding pads can be achieved by wedge-wedge bonding. In the case where the bonding wire is connected to the bonding pads by wedge-wedge bonding, the height of the loop formed by the bonding wire is lower than that in the case of using ball-wedge bonding. Also, the bonding wire and the bonding pads may be bonded by stitch bonding or ribbon bonding. In stitch bonding, the bonding length is short and the height of the loop formed by the bonding wire is low, compared to ball bonding (ball-wedge bonding), and thus stitch bonding has been widely used for packaging radio frequency circuits. In particular, the electrical performance of the bonding wire inductor according to the present invention is lowered by the resistance of the metal strip. Thus, by replacing the metal strip with a bonding wire, resistance of the metal strip can be decreased and unavoidable generation of the parasitic capacitance can be further decreased, thus increasing the Q-factor and resonant frequency.

In addition, the bonding wire may have a ribbon or round shape, or may have a rectangular section. The bonding wire may be formed of gold (Au), aluminum (Al), copper (Cu) or alloys thereof, and preferably, Au is used.

The metal strip which is in contact with the substrate may be formed of Au, Al, Cu or alloys thereof, and preferably, Au or alloys thereof is used.

According to the present invention, there is provided a method for manufacturing the bonding wire inductor, comprising the steps of forming at least one pair of bonding pads facing each other, on a substrate. Then, the facing bonding pads are connected with a bonding wire which is suspended from the substrate, thus forming a loop.

In a multi-loop bonding wire inductor having two or more pairs of bonding pads, such as the one mentioned above, some bonding pads can be connected by a metal strip, wherein the metal strip and the bonding pads can be formed by a lift-off method.

After a bonding process for connecting the bonding pads with bonding wires, the bonding wire inductor can be packaged with epoxy resin or can be fixed by hermetic packaging.

A semiconductor substrate on which the bonding wire inductor according to the present invention can be formed, may be a gallium arsenide (GaAs) substrate, a silicon substrate, an alumina substrate, a fluorine-resin substrate, an epoxy substrate, a ceramic substrate, a silicon-on-insulator (SOI) substrate, a lithium tantalate (LiTaO$_3$) substrate, a lithium niobate (LiNbO$_3$ substrate, a low temperature co-fired ceramic (LTCC) substrate, a quartz substrate, a glass substrate or a printed circuit board. Preferably, the silicon substrate or GaAs substrate is used. In general, in the case of using a silicon substrate, an insulating layer is formed on the silicon layer, and silicon oxide (SiO$_2$), silicon nitride (Si$_3$N$_4$) or polyimide is used as an insulating material.

A bonding wire inductor can be achieved by fine pitch wire bonding equipment, which bonds highly elastic bonding wires having a diameter of 25–100 μm. By using existing wire bonding technology used for RFICs and MMICs, which is automated and commercially available, the wire bonding can be implemented using bonding wires having a diameter of 25 μm at a minimum pad pitch of 55 μm.

Also, the thickness of the substrate may be approximately 100–625 μm, and is preferably, about 100 μm. The line width of the metal strip may be in the range of about 15–30 μm, and the thickness thereof may be in the range of about 2–5 μm. The Q-factor improves as the thickness of the metal strip increases. However, increasing the thickness of the metal strip requires additional expensive material, thereby increasing the unit cost for production. Preferably, the area of the bonding pad is in the range of about 50×50 μm–90×90 μm. In general, the performance of a device is improved with a decrease in the pad area, and thus the pad area can be reduced if required. The electrical characteristics of a bonding wire which forms a loop having a predetermined height, by connecting a pair of bonding pads, are improved as the diameter of the bonding wire increases. However, a bonding wire diameter of about 25 μm is desirable. Also, preferably, in ball-wedge bonding, the height of the loop is in the range of about 70–1,000 μm, and more preferably, about 350 μm. Also, the bonding length between the bonding pad may be about 0.5 mm.

The area occupied by the bonding wire inductor according to the present invention is equal to that occupied by a spiral inductor. However, because bonding wires are suspended from a substrate, the effect of the magnetic field on other devices can be minimized, in addition to reducing the substrate loss (dielectric loss). As a result, a solenoid type inductor can be achieved, which is an ideal inductor suitable for high efficiency inductance. In a conventional spiral inductor, loss in a semiconductor substrate was a significant consideration in designing. Thus, in the aspect of substrate loss, the bonding wire inductor according to the present invention, which is suspended from the substrate, is highly effective in solving the problem of loss in silicon substrates.

Also, the bonding wire inductor according to the present invention can be applied in a coupler or transformer, by arranging two bonding wire inductors such that they are adjacent to each other. In arranging a plurality of bonding wire inductors in a voltage controlled oscillator (VCO) or other radio frequency devices, the bonding wire inductors can be arranged such that the directions of the magnetic fields are perpendicular to each other, in order to minimize magnetic interference.

BRIEF DESCRIPTION OF THE DRAWINGS

FIG. 4AA shows a side view of the bonding wire inductor in FIG. 4A;

BEST MODE FOR CARRYING OUT THE INVENTION

Figure 1:
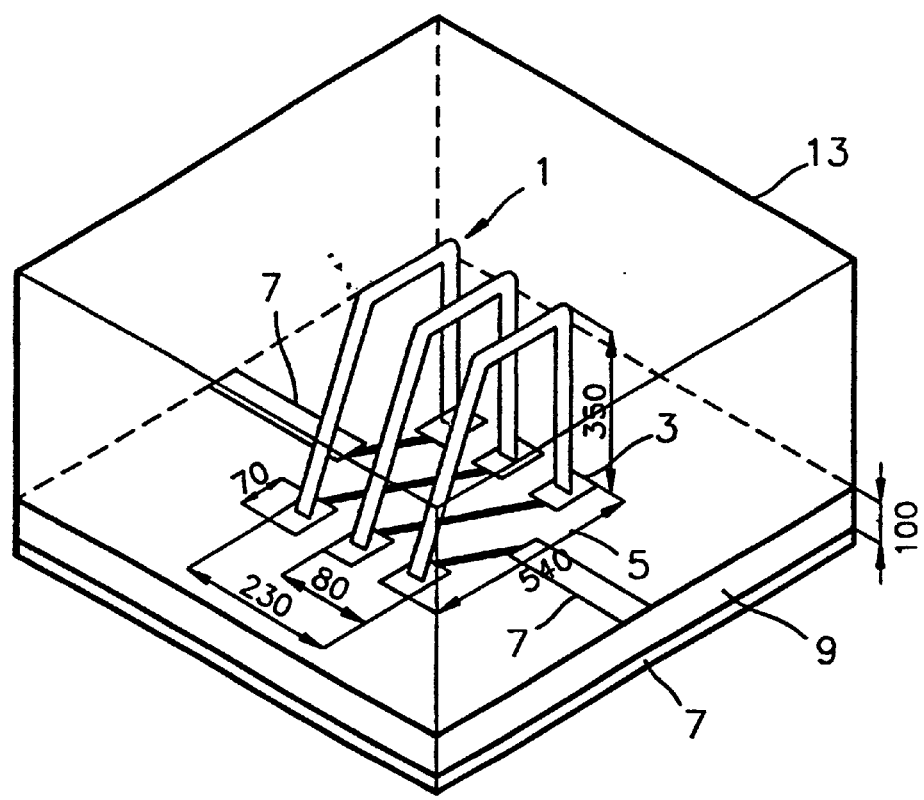
FIG. 1 is a perspective view of an example of a bonding wire inductor on a gallium arsenide (GaAs) substrate according to the present invention.

Referring to FIG. 1, the structure of a bonding wire inductor according to the present invention includes three pairs of bonding pads 3 each of 70×70 $\mu$m, and metal strips 5 having a thickness of 2 $\mu$m and a line width of 20 $\mu$m, which diagonally connect the bonding pads 3 and three bonding wires 1 each having a diameter of 25 $\mu$m, for connecting each pair of bonding pads facing each other, which are formed on a gallium arsenate (GaAs) substrate 9 deposited to a thickness of 100 $\mu$m on a dielectric or metallic bottom plate 11. The bonding wire 1 has a loop shape having a height of 350 $\mu$m and the plane formed by the loop is perpendicular to the surface of the substrate. The pad pitch which determines the wire spacing, is 80 $\mu$m and the area occupied by the bonding wire inductor is 540×230 $\mu$m. Each pair of bonding pads 3 and a bonding wire 1 are ball-wedge bonded each other to form a 3-loop bonding wire inductor. The bonding wire 1 and the metal strip 5 are formed of gold (Au) and the bonding wire inductor is packaged by molding it with epoxy resin 13 after the wire bonding process.

Figure 2:
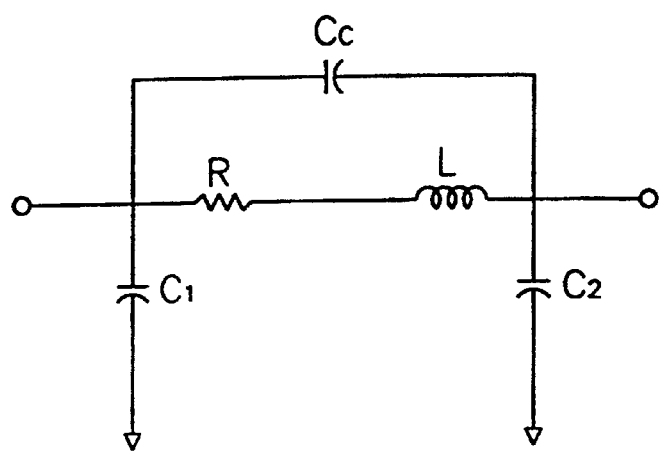
FIG. 2 is an equivalent circuit diagram illustrating the characteristics of a bonding wire inductor according to the present invention.

The equivalent circuit of FIG. 2 is for comparing the effective inductance, the Q-factor and the self-resonant frequency of the vertical bonding wire inductor according to the present invention and those of a conventional horizontal spiral inductor. In the case of the horizontal spiral inductor, $C_1$ and $C_2$ represent the self-capacitances of striplines on a semiconductor substrate, Cc represents the mutual capacitance between striplines, and R and L represent the resistance and inductance of the stripline, respectively. In the case of the vertical bonding wire inductor according to the present invention, $C_1$ and $C_2$ represent the capacitances of the stripline and bonding pad, respectively, Cc represents the mutual capacitance between the bonding wire and the stripline, R represents the resistance due to the substrate and ohmic losses of the stripline and the ohmic and radiation losses of the bonding wire, and L represents the inductance of the stripline and the bonding wire.

Prior to manufacturing a vertical bonding wire inductor according to the present invention, the inventors simulated the wide band characteristics of both the vertical bonding wire inductor according to the present invention and a conventional spiral inductor. In order to analyze the wide band characteristics, a commercially available high frequency structure simulator (HFSS, HP85180A, manufactured by Hewlett-Packard Co.) adopting a finite element method (FEM) was used. According to the simulation using the FEM, a 3-dimensional finite mesh was repetitively generated such that the result was within a 3% error range of the convergence region. In order to produce accurate results, a metal stripline of 50 $\Omega$ was extended such that irregular electric and magnetic fields due to the electric field applied to an input port did not change the characteristics of the inductor, and then the extended line was de-embedded to analyze the characteristics of the inductor on the reference plane of FIG. 1. In order to take into account minor radiation effects at the boundary of the bonding wire except for the input and output ports 7, a boundary condition which was the closest to the actual situation was set by applying absorbing boundary conditions (ABC) to a position being far away from the inductor.

A wideband simulation of the vertical bonding wire inductor, of up to 10 GHz, showed improvements in inductance by approximately 6%, in self-resonant frequency by approximately 8.5% and in Q-factor by approximately 360%, compared to those of the horizontal spiral inductor having the same area under the same environment.

Embodiment 1
Fabrication of Vertical Bonding Wire Inductor on GaAs Substrate

In order to effectively observe the electrical characteristics of an inductor, design parameters such as loop pitch, number of loops, line width, bonding pad area and bonding length were varied. The bonding pad was designed with three different sizes of 90×90 $\mu$m, 80×80 $\mu$m and 70×70 $\mu$m, and pad pitches were varied to 105 $\mu$m, 100 $\mu$m and 85 $\mu$m in order to observe the magnetic flux linkage of the inductor.

In order to fabricate the inductors according to the above design, a bottom plate 11 was formed of metal or dielectric substance, and a GaAs substrate 9 was formed thereon to a thickness of 500 $\mu$m. Four pairs of bonding pad 3 arranged on the substrate 9 in two rows and a metal stripline 5 for diagonally connecting the bonding pads A were formed by a lift-off process.

Figure 3:
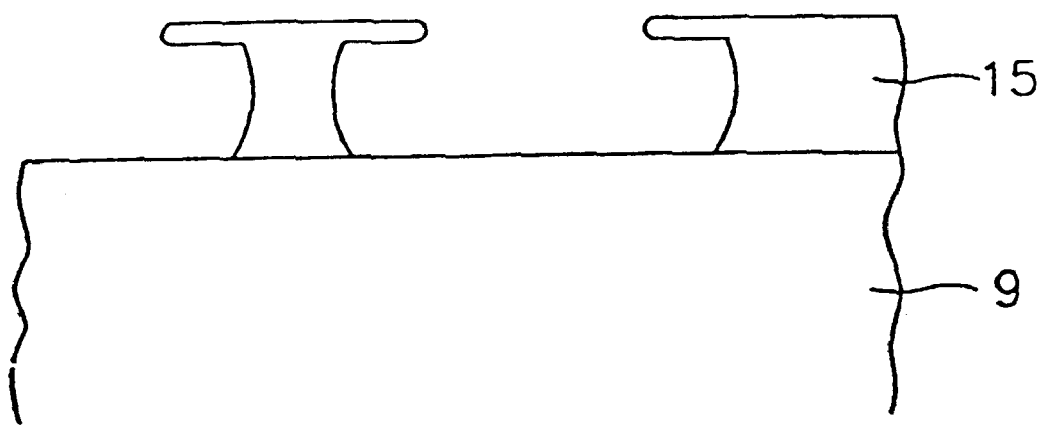
FIG. 3 is a vertical sectional view of an undercut of a photoresist layer.

In order to form a photoresist film suitable for the lift-off process, AZ5214 photoresist film was used, and the photoresist film was undercut by a phase transition process as shown in FIG. 3 in order to clean and easily form a metal pattern. Chromium (Cr) was deposited to a thickness of 200 Å on the photoresist film pattern 15 formed as shown in FIG. 3, in order to improve adhesion with the substrate 9, and Au was deposited thereon to a thickness of 0.8 $\mu$m. After the lift-off process was completed, the thickness and line width were measured, which were equal to the design values. A wire bonding process for connecting the bonding pads formed on the 500 $\mu$m-thick GaAs substrate was performed using a Shinkawa UTC-3000 BI bonder, an automatic bonding machines used in a general production line, which can control the height and shape of the bonding.

Figure 4A:
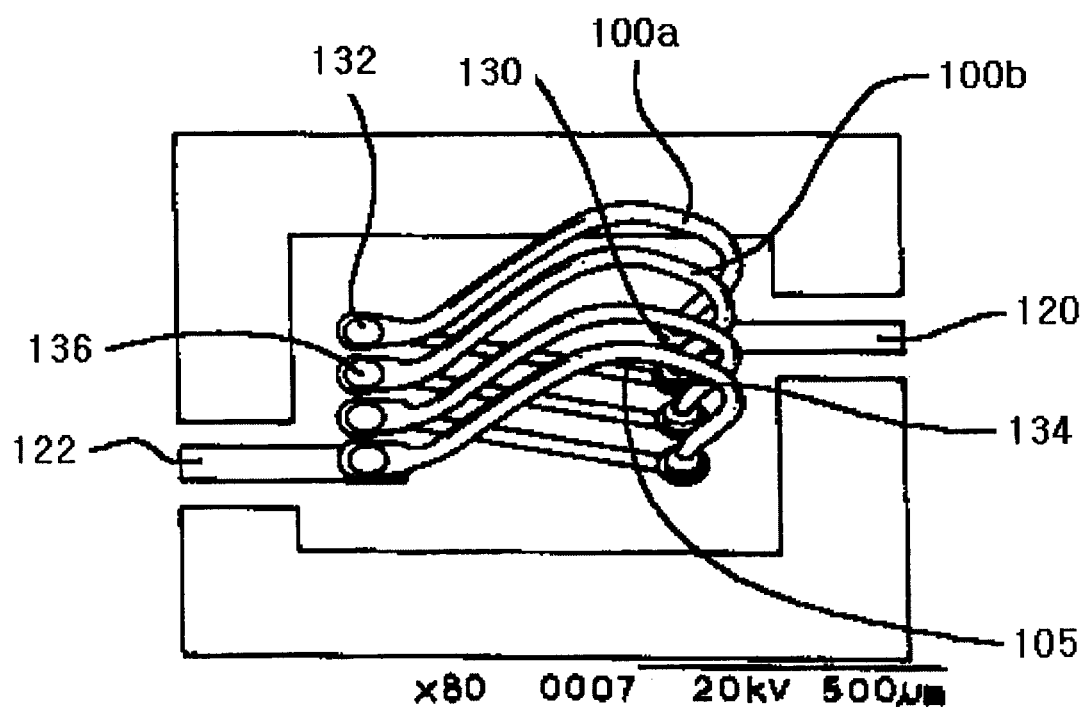
FIG. 4A shows a 4-loop vertical bonding wire inductor fabricated by a method according to the present invention.
Figure 4A:
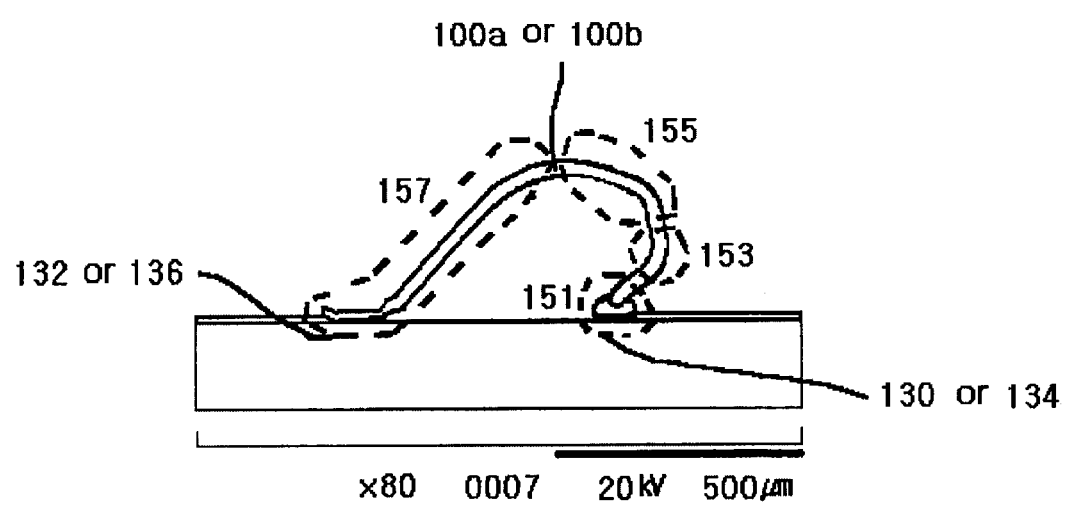

The fabricated vertical bonding wire inductor according to the present invention is shown in FIG. 4A. The bonding wire inductor of FIG. 4A was formed by four bonding wires having a 25 $\mu$m-diameter and a 350 $\mu$m height, and a stripline having a 0.82 $\mu$m thickness and a 30 $\mu$m width. The bonding pad had a size of 70×70 $\mu$m and a pad pitch of 85 $\mu$m.

Thus, as shown in FIGS. 4A–4AA, a bonding wire inductor of the present invention may comprise a first inductor terminal (120) and a second inductor terminal (122) formed on a substrate having a main surface; a first bonding pad (130) connected to the first inductor terminal; a second bonding pad (132) connected to the second inductor terminal; a first bonding wire (100a) connected between the first and second bonding pads; said first bonding wire including a first member (151) bonded to the first bonding pad, a second member (153) coupled to the first member and rising from the main surface of the substrate in a direction opposing to the second bonding pad; a third member (155) coupled to the second member and rising up to a wire loop height in a direction toward the second bonding pad, and a fourth member (157) coupled to the third member and descending toward the second bonding pad to be bonded to the second bonding pad; and said wire loop height ranging from 100 $\mu$m to 1,000 $\mu$m.

Figure 24A:
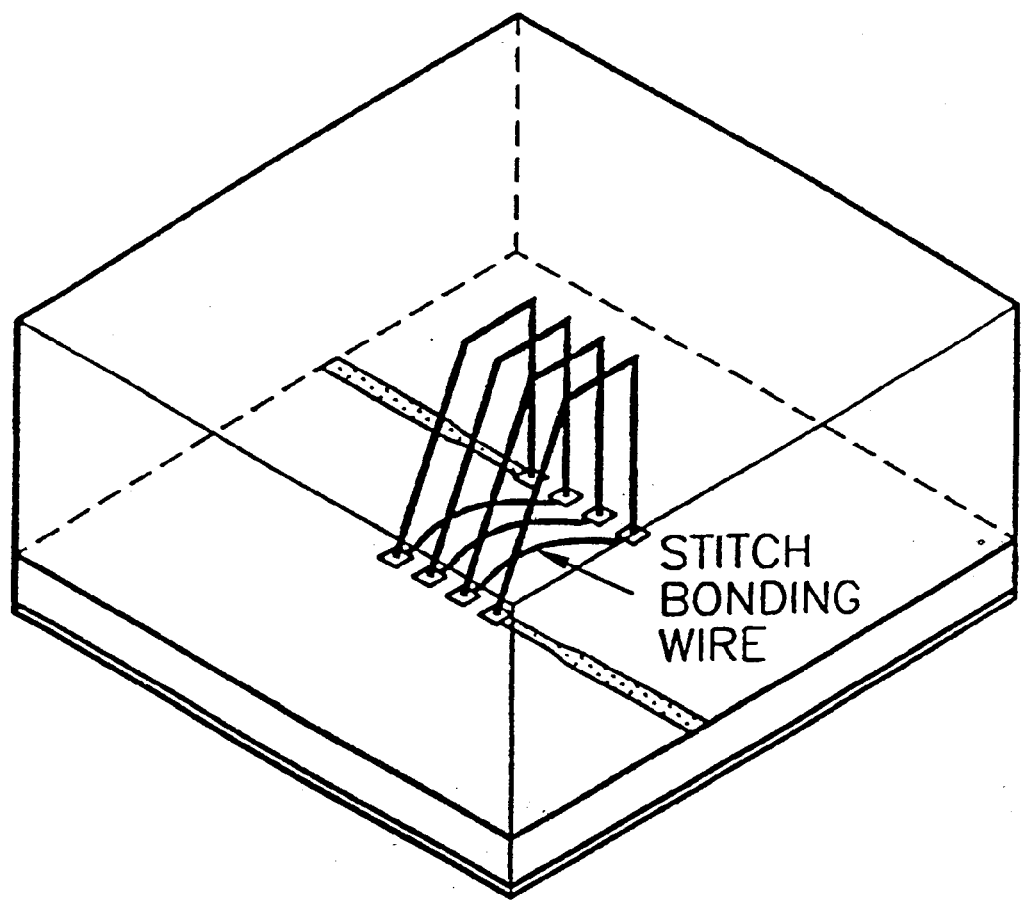
FIG. 24A is a conceptual perspective view of another vertical bonding wire inductor on a GaAs substrate or silicon substrate.
Figure 24B:
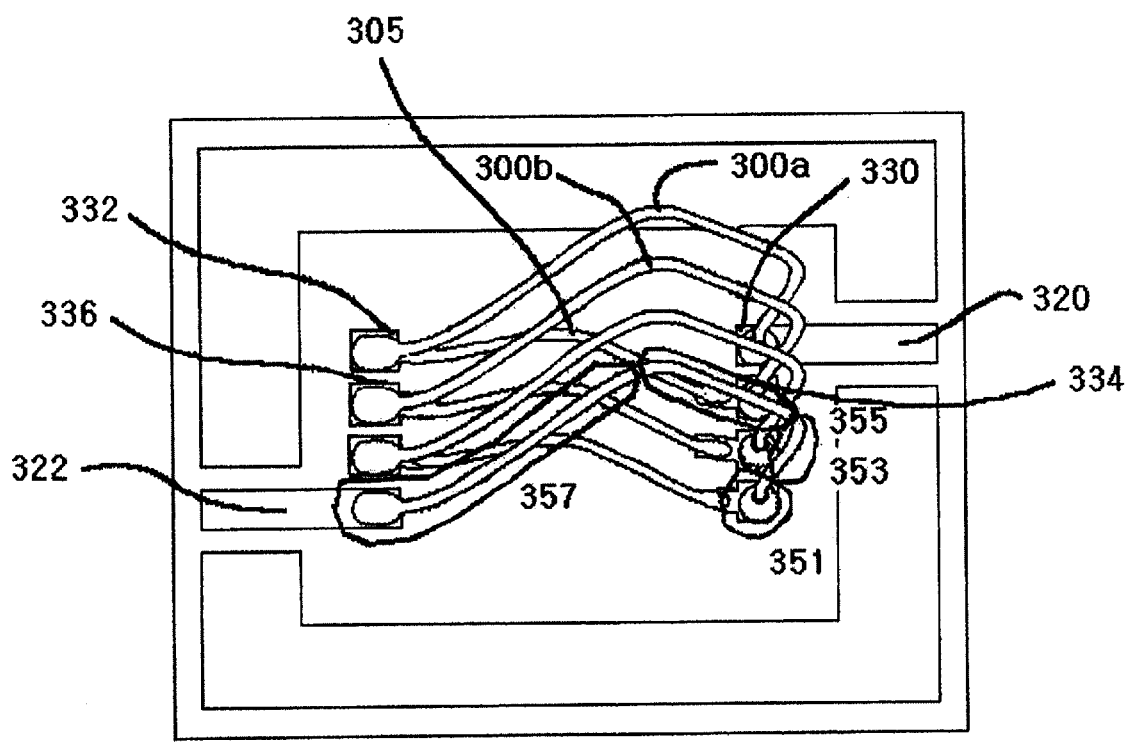
FIG. 24B shows a 4-loop vertical bonding wire inductor fabricated by another method according to the present invention.

In another embodiment, as shown in FIG. 24B, a bonding wire inductor of the present invention may comprise a first inductor terminal (320) and a second inductor terminal (322) formed on a substrate having a main surface; first bonding pad (330) connected to the first inductor terminal; second bonding pad (336) connected to the second inductor terminal;a first main bonding wire (300a) connected between the first bonding pad and a third bonding pad (332); a second main bonding wire (300b) connected between the second bonding pad and a fourth bonding pad (334); a sub bonding wire (305) connected between the third bonding pad (332) and the fourth bonding pad (334); said first main bonding wire including a first member (351) bonded to the first bonding pad, a second member (353) coupled to the first member and rising from the main surface of the substrate in a direction opposing to the third bonding pad; a third member (355) coupled to the second member and rising up to a wire loop height in a direction toward the third bonding pad, and a fourth member (357) coupled to the third member and descending toward the third bonding pad to be bonded to the third bonding pad; said second main bonding wire including a first member (351) bonded to the fourth bonding pad, a second member (353) coupled to the first member and rising from the main surface of the substrate in a direction opposing to the second bonding pad; a third member (355) coupled to the second member and rising up to a wire loop height in a direction toward the second bonding pad, and a fourth member (357) coupled to the third member and descending toward the second bonding pad to be bonded to the second bonding pad; said wire loop height of the first and second main bonding wires ranged from 100 $\mu$m to 1,000 $\mu$m; and said sub bonding wire electrically interconnecting the third and fourth boding pads in place of a metal strip line (105).

Figure 4B:
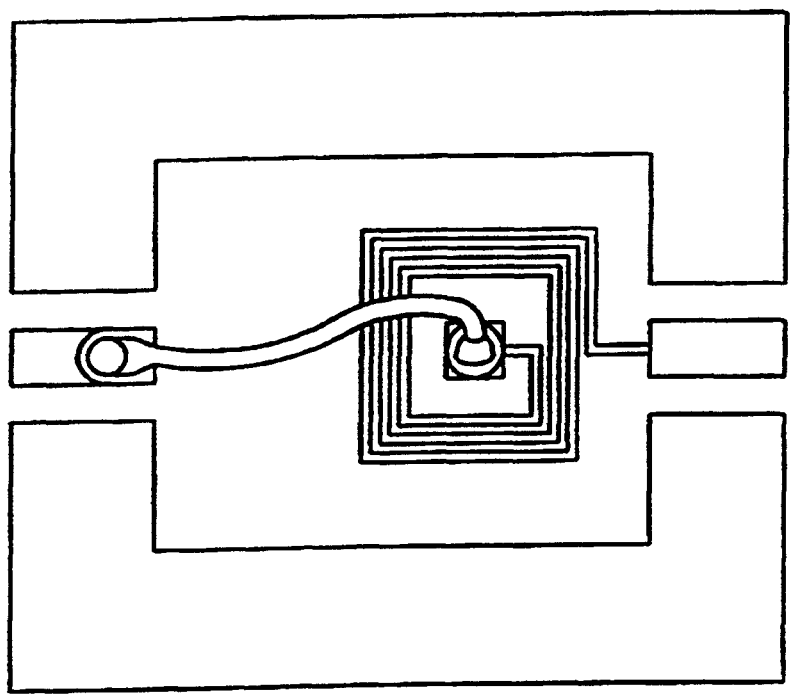
FIG. 4B shows a 3.5 turn spiral inductor as a comparative example to the present invention.

A spiral inductor is shown in FIG. 4B as a comparative example to the bonding wire inductor according to the present invention. In the fabricated spiral inductor, an air bridge line for connecting the center of a spiral arm and a port was fabricated to a height of 120 $\mu$m by the wire bonding process. By using the wire bonding process, additional photolithography and metallization processes for forming the air bridge line could be omitted. The spiral inductor had the same line width, line spacing and number of turns as those of a high Q-inductor which is designed by Shih. The stripline of the fabricated spiral inductor had a 0.82 $\mu$m-thickness, a 20 $\mu$m-line width and a 15 $\mu$m-line spacing. The bonding height, length and shape, which are parameters determining the electrical characteristics of the bonding wire inductor could be automatically controlled due to a continuous development of bonder and bonding technology.

Figure 5:
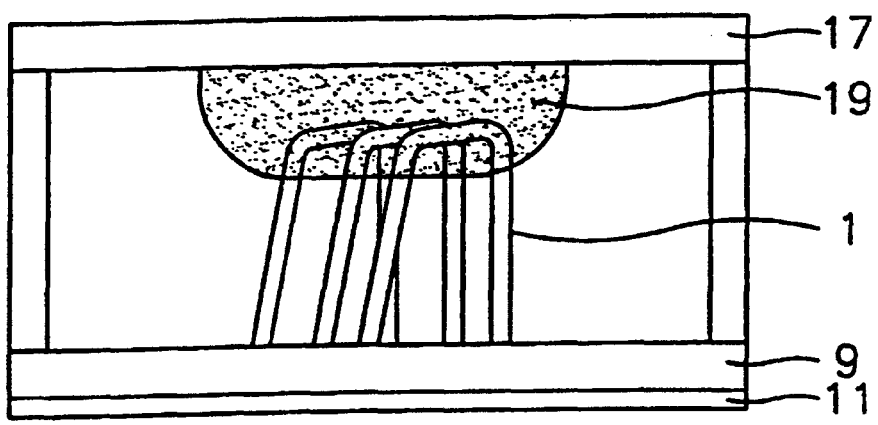
FIG. 5 shows an example of hermetic packaging of the bonding wire inductor according to the present invention.

After the wire bonding process, the bonding wire inductor was fixed by a plastic molding or hermetic packaging process. In the plastic molding, the bonding wire is molded by FR-4 composite or epoxy resin (E010116j, manufactured by HYSOL, Japan) having a dielectric constant of 4.3, so that mechanical and electrical characteristics thereof can be maintained to be stable. More stable characteristics can be achieved by coating the bonding wire with an insulating material before the molding process. The FR-4 component as a polymeric compound, is widely used as a low frequency plastic molding compound (EMC) and for a printed circuit board (PCB) due to its mechanical and electrical stability and economical merit. In the hermetic packing, as shown in FIG. 5, the bonding wires 1 formed on the substrate 9 are sealed by ceramic, plastic or metal 17. Here, in order to prevent vibration of the bonding wires 1, the upper part of the bonding wires 1 can be fixed by epoxy resin 19. In addition, in the vertical bonding wire inductor according to the present invention, a magnetic material (not shown) may be inserted into the loop formed by the bonding wires 1.

Also, the electrical characteristics such as inductance and Q-factor, of the bonding wire inductor according to the present invention vary according to the shape of the bonding wire (height or area of the loop). Thus, the shape of the formed bonding wires can be changed mechanically before the packing process, so that bonding wire inductors having various electrical characteristics can be manufactured with a high degree of freedom in designing.

Embodiment 2
Test of Characteristics of Bonding Wire Inductors and Spiral Inductors on GaAs Substrate The S-parameters of the bonding wire inductors and spiral inductors manufactured in Embodiment 1 were measured using a vector network analyzer (HP 8510C) and a cascade microwave probe station [David M. Pozar, 1990, *Microwave Engineering*, Addision-Wesley Publishing Co., Inc., pp. 220–221]. For the measurement, LRM calibration was performed on Impedance Standard Substrate (ISS) and a de-embedding process was performed in order to remove the effects of test jig.

Figure 6:
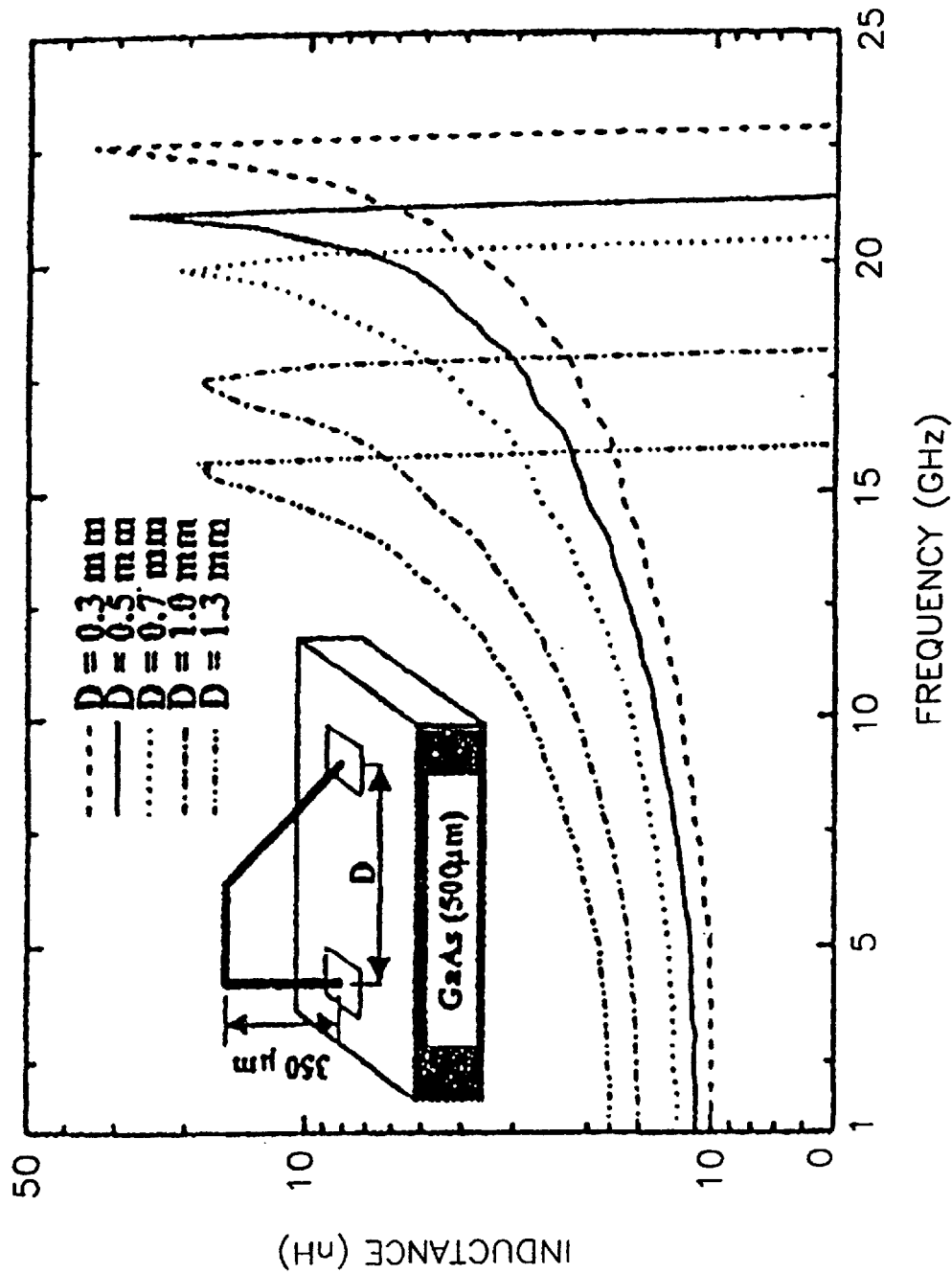
FIG. 6 is a graph in which the inductances of single loop bonding wire inductors having various bond-pad spacings on a GaAs substrate are plotted with respect to frequency.
Figure 7:
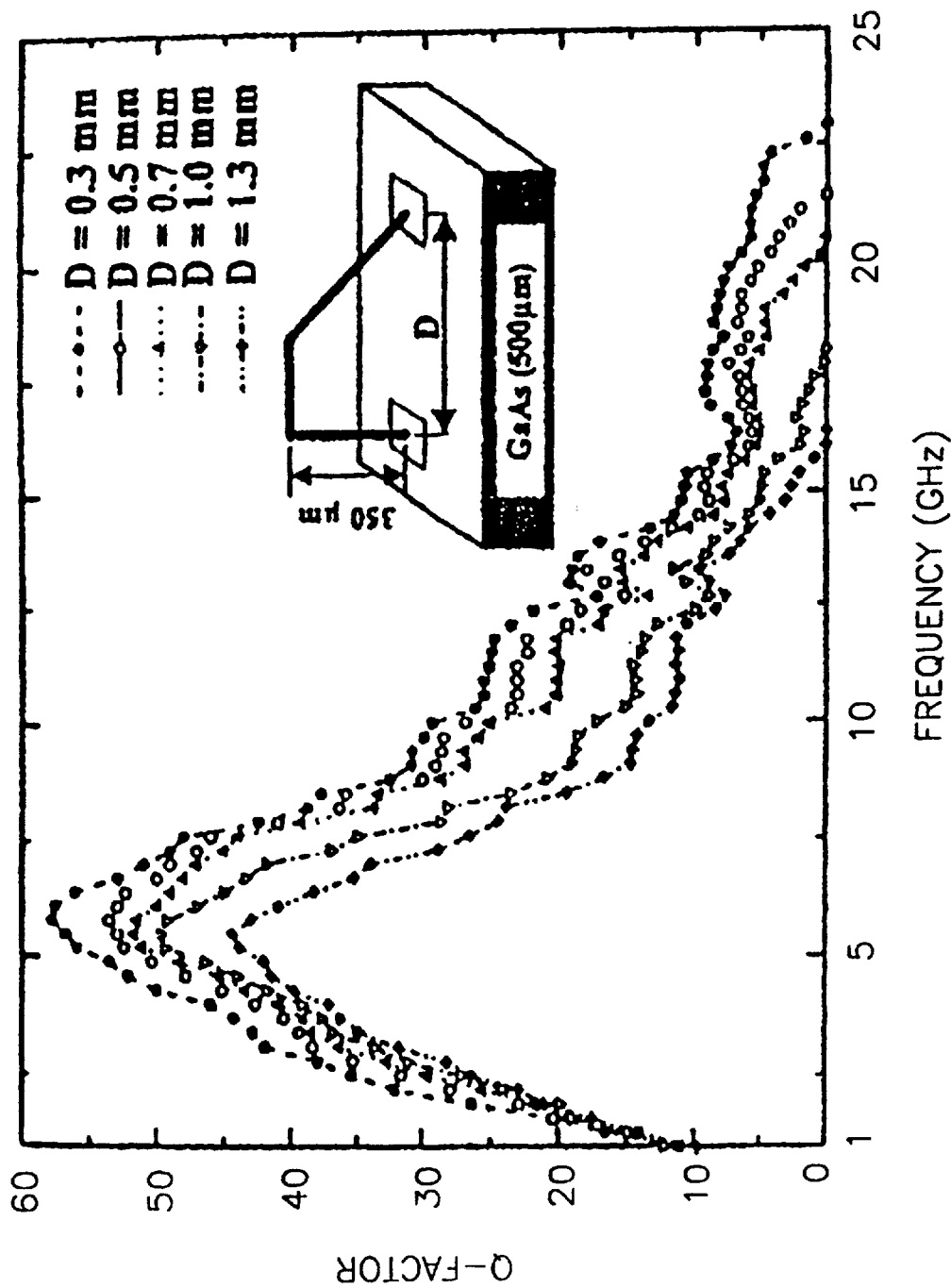
FIG. 7 is a graph plotting the Q-factors of single loop bonding wire inductors having various bond-pad spacings on a GaAs substrate are plotted with respect to frequency.

The inductance and Q-factor of the bonding wire inductor according to the present invention, formed by connecting a pair of bonding pads having a size of 90×90 $\mu$m, which were formed on a GaAs substrate, with only one bonding wire, were measured by on-wafer measurement by varying the bonding length from 0.3 mm to 1.3 mm and the measurement frequency from 1 GHz to 25 GHz. The results are shown in FIGS. 6 and 7. FIG. 6 shows that the inductance is in the range of 1–1.8 nH at 1 GHz and the resonant frequency is in the range of 16–23 GHz. As can be seen from FIG. 7, the bonding wire has the maximum Q-factor at the frequency of 6 GHz and the Q-factor is in the range of 44–58 at the inductance range of 1–1.8 nH. The reason for a slow decrease in the Q-factor at the frequency of 6 GHz or more showing the maximum Q-factor is that the ohmic loss of the bonding wire increases at this frequency.

Figure 8:
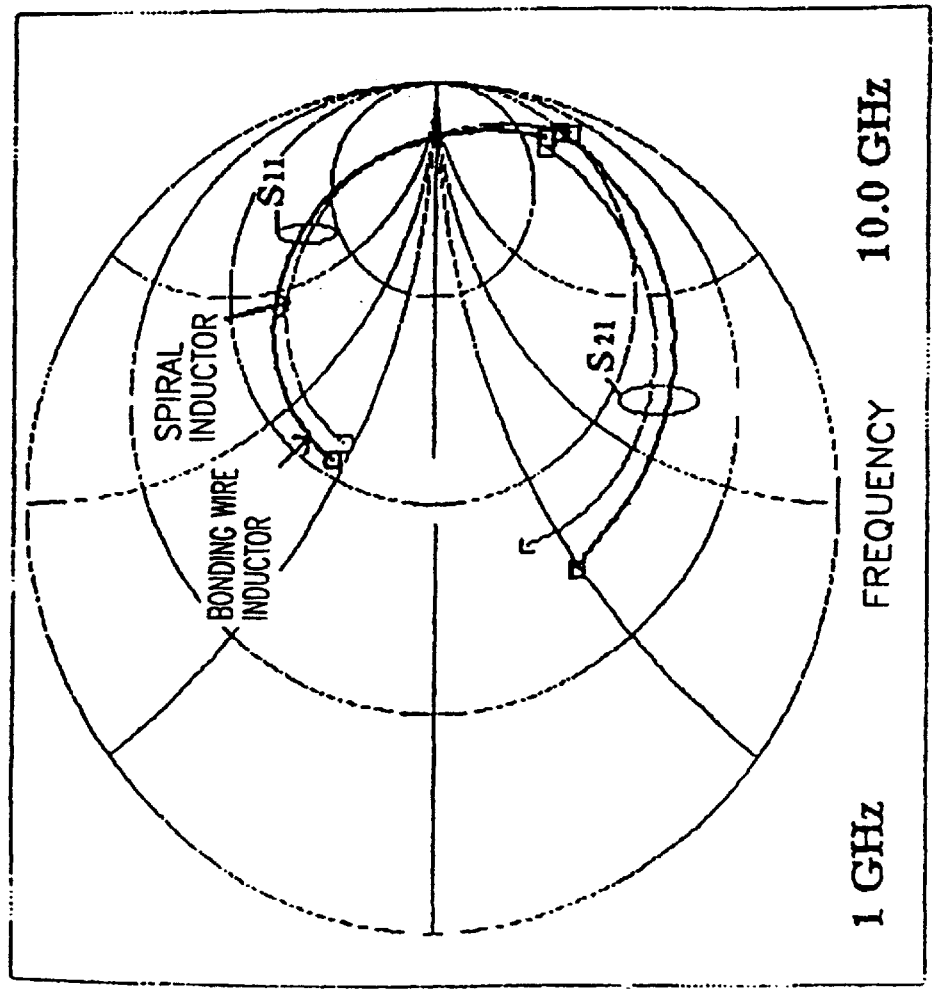
FIG. 8 is a Smith chart in which the S-parameters of a 4-loop vertical bonding wire inductor (0.82 $\mu$m-thick metal strip) and a 3.5-turn spiral inductor on GaAs substrate are measured by on-wafer measurement and plotted.
Figure 9:
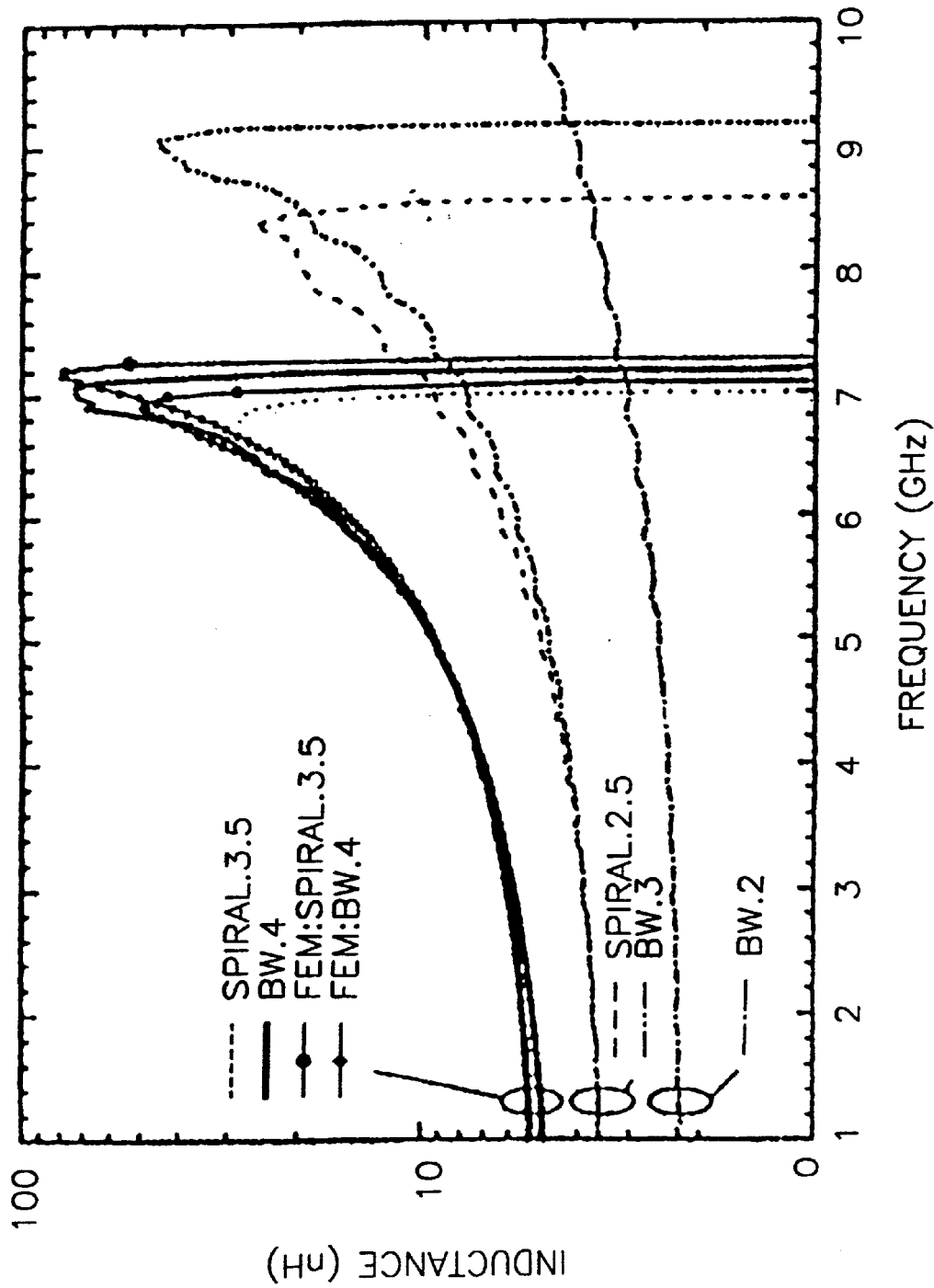
FIG. 9 is a graph of the inductances of vertical bonding wire inductors and spiral inductors, calculated using the S-parameters of FIG. 8.
Figure 10:
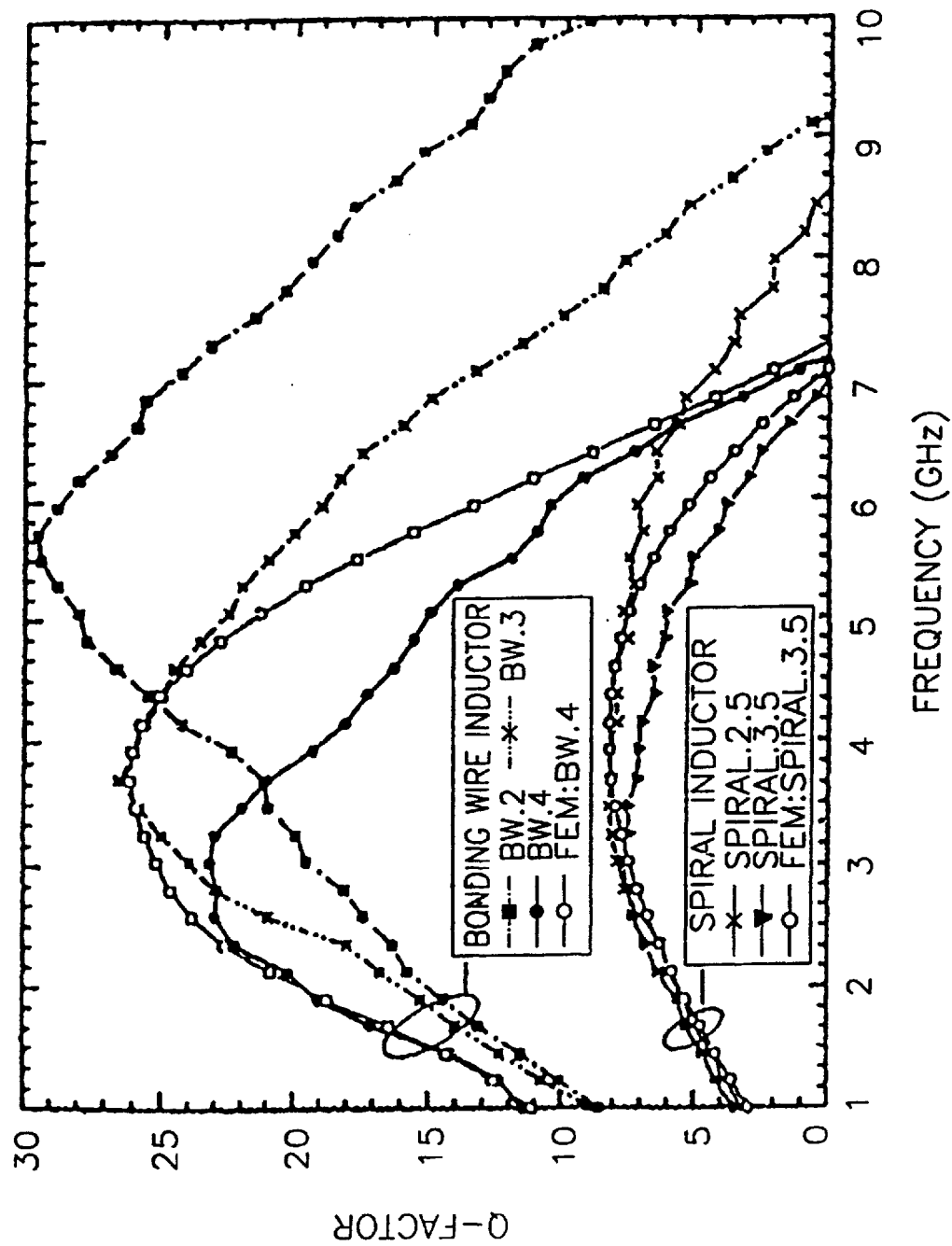
FIG. 10 is a graph of the Q-factors of vertical bonding wire inductors and spiral inductors, calculated using the S-parameters of FIG. 8.

The multi-loop bonding wire inductor and the spiral inductor formed on a GaAs substrate were measured by on-wafer measurement while varying the frequency in the range of 1–10 GHz, and the S-parameters of a 2-port network were plotted on the Smith chart of FIG. 8. Among the S-parameters, S12 is equivalent to S21 by the reciprocity theorem and S22 approximates S11 due to symmetrical structure, so that only S11 and S21 are represented in FIG. 8. The inductance and the Q-factor of the device were extracted by using input impedance obtained from the S-parameters measured when one port of the inductor was grounded, and the results are shown in FIGS. 9 and 10. In FIGS. 9 and 10, SPIRAL indicates the spiral inductor and BW indicates the bonding wire inductor. Also, reference numerals such as 3.5 and 4 represent the number of turns or the number of loops. These legends provide the same meaning in other drawings.

FIG. 9 shows that the inductance of the bonding wire inductor increases as the number of loops of the bonding wire inductor increases, similar to the increase in the number of turns of the spiral inductor.

The inductances of 3-loop bonding wire inductor consisting of three wires and 4-loop bonding wire inductor consisting of four wires, show the same characteristics as those of 3.5-turn and 2.5-turn spiral inductor, respectively. Because the spiral inductor structurally has a narrow loop spacing, the mutual inductance is increased, resulting in a desired high inductance. However, the bonding wire inductor which has a loop spacing wider than that of the spiral inductor, can effectively produce high inductance by enlarging bonding wire loops perpendicular to the ground plane. FIGS. 9 and 10 show that the bonding wire inductor has an improved resonant frequency compared to the spiral inductor having similar inductance. The reason for this is that in view of the mutual capacitance which is a critical factor in determining the resonant frequency of the inductor, the bonding wire inductor shows a small parasitic mutual capacitance characteristic due to the loop pitch of more than 85 $\mu$m. FIGS. 9 and 10 also show the inductances, resonant frequencies and the Q-factors of the bonding wire inductor and spiral inductor, calculated by FEM analysis. The Q factors of the spiral inductors are less than 10 while the bonding wire inductors according to the present invention have very high Q-factors of more than 23.

Figure 11:
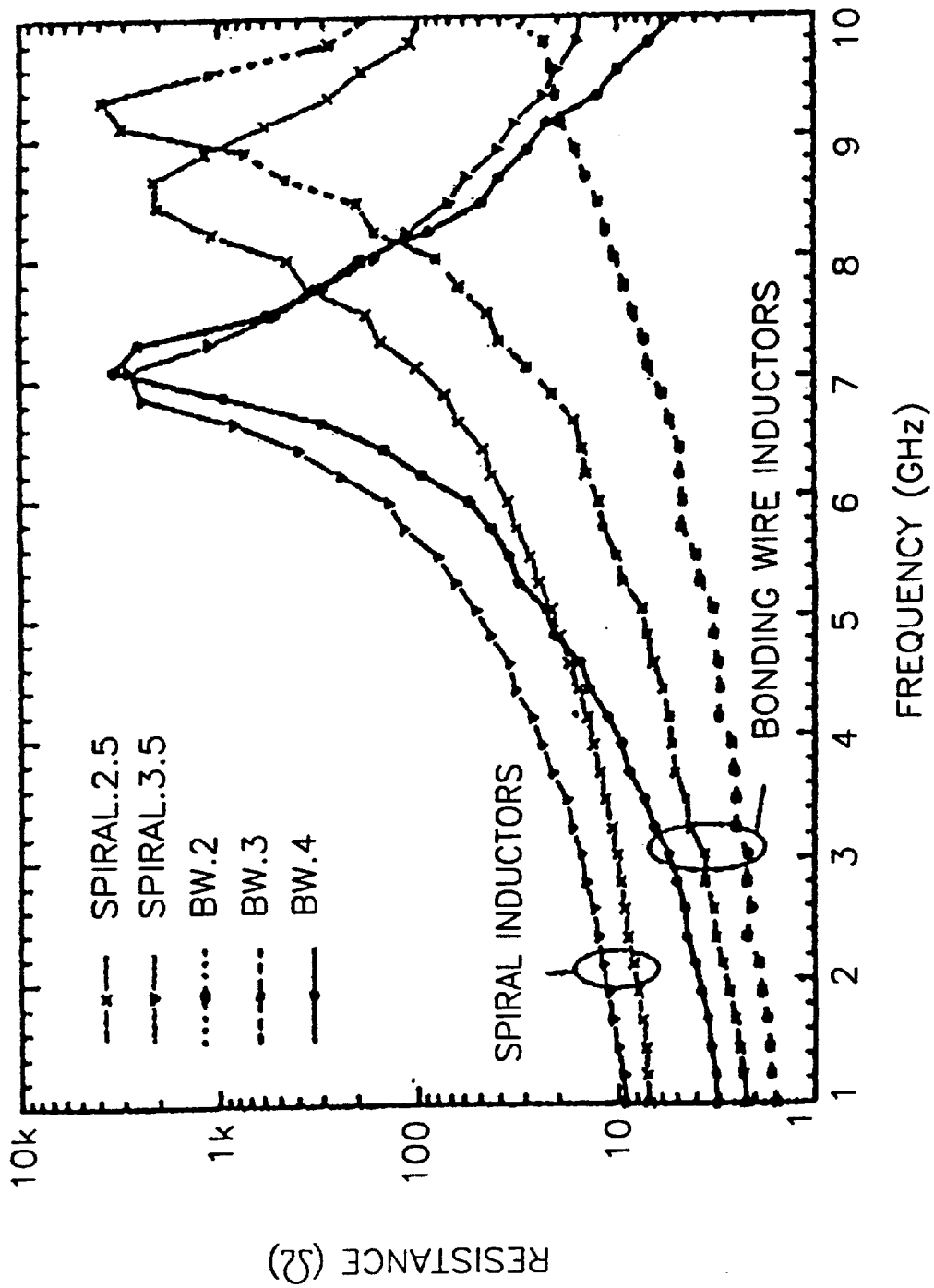
FIG. 11 is a graph of the resistances of vertical bonding wire inductors (0.82 $\mu$m-thick metal strip) and spiral inductors on a GaAs substrate.

In order to investigate the reason for the improved high Q-factor of the bonding wire inductor, resistance characteristics of an unloaded inductor are shown in FIG. 11. As shown in FIG. 11, the resistance of the bonding wire inductor is relatively low with respect to the spiral inductor at the frequency lower than the usable frequency range.

For efficient comparison between the bonding wire inductor according to the present invention and the spiral inductor, electrical characteristics thereof are shown in TABLE 1.

As can be seen in TABLE 1, the 3-loop bonding wire inductor has equal inductance to the 2.5-turn spiral inductor. However, the resonant frequency and Q-factor of the bonding wire inductor are improved by about 7% and 223%, respectively. Also, the 4-loop bonding wire inductor shows similar electrical characteristics to those of the 3.5-turn spiral inductor.

Figure 12:
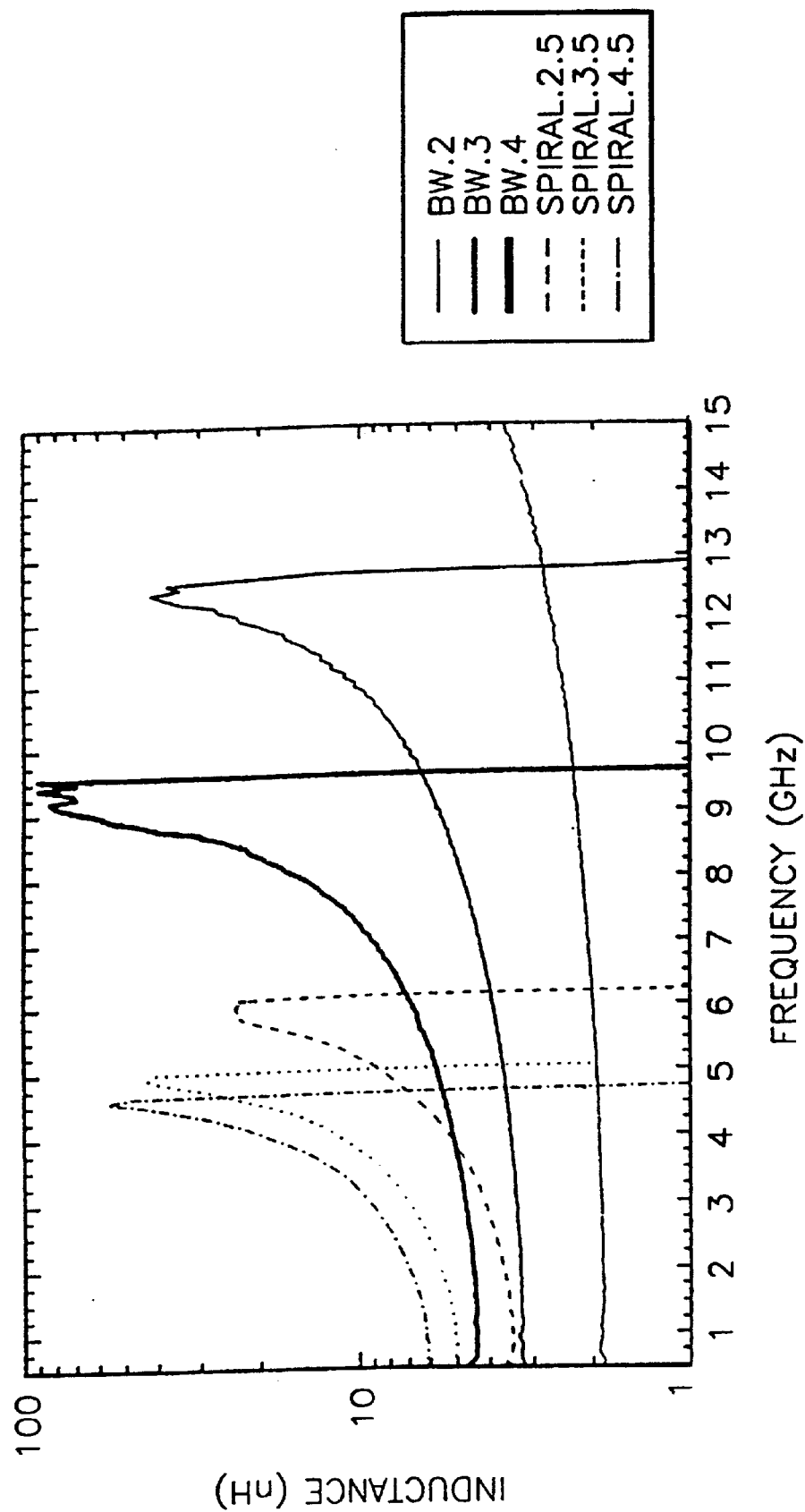
FIG. 12 is a graph of the inductances of vertical bonding wire inductors (2 $\mu$m-thick metal strip) and spiral inductors on a GaAs substrate.
Figure 13:
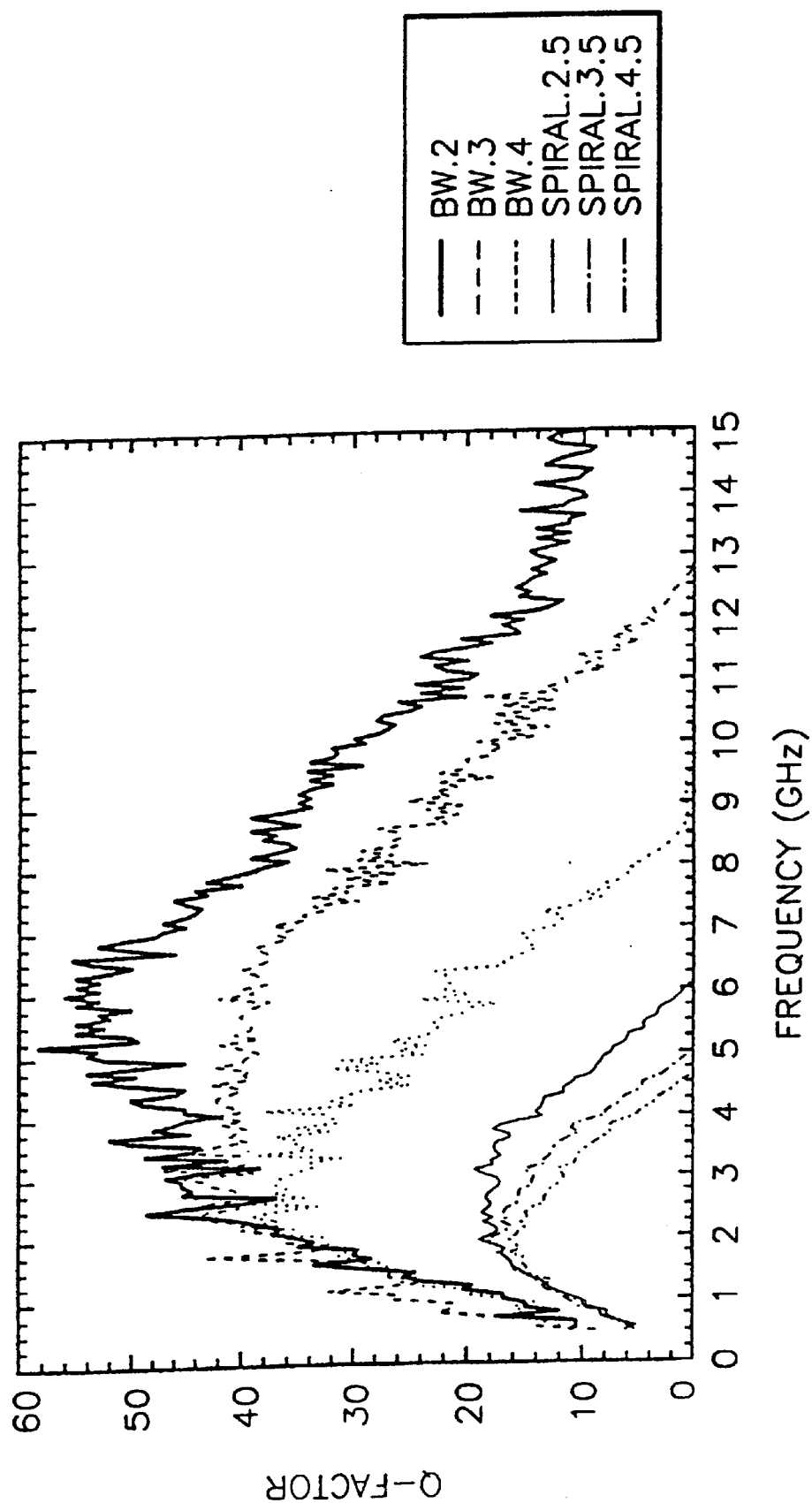
FIG. 13 is a graph of the Q-factors of vertical bonding wire inductors (2 $\mu$m-thick metal strip) and spiral inductors on a GaAs substrate.
Figure 14:
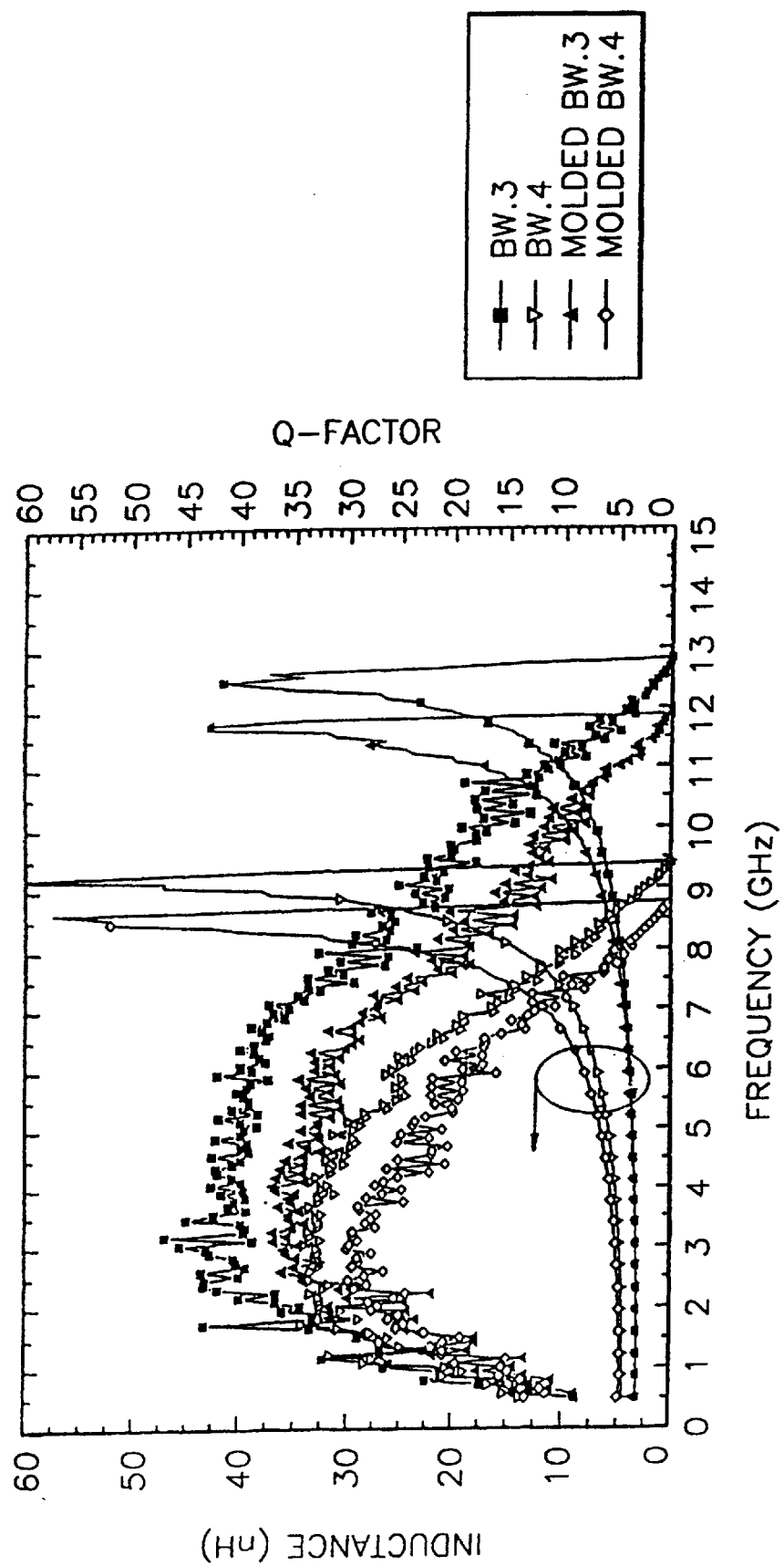
FIG. 14 is a graph of the inductances and the Q-factors of vertical bonding wire inductors on a GaAs substrate (2 $\mu$m-thick metal strip) before and after molding.
Figure 15:
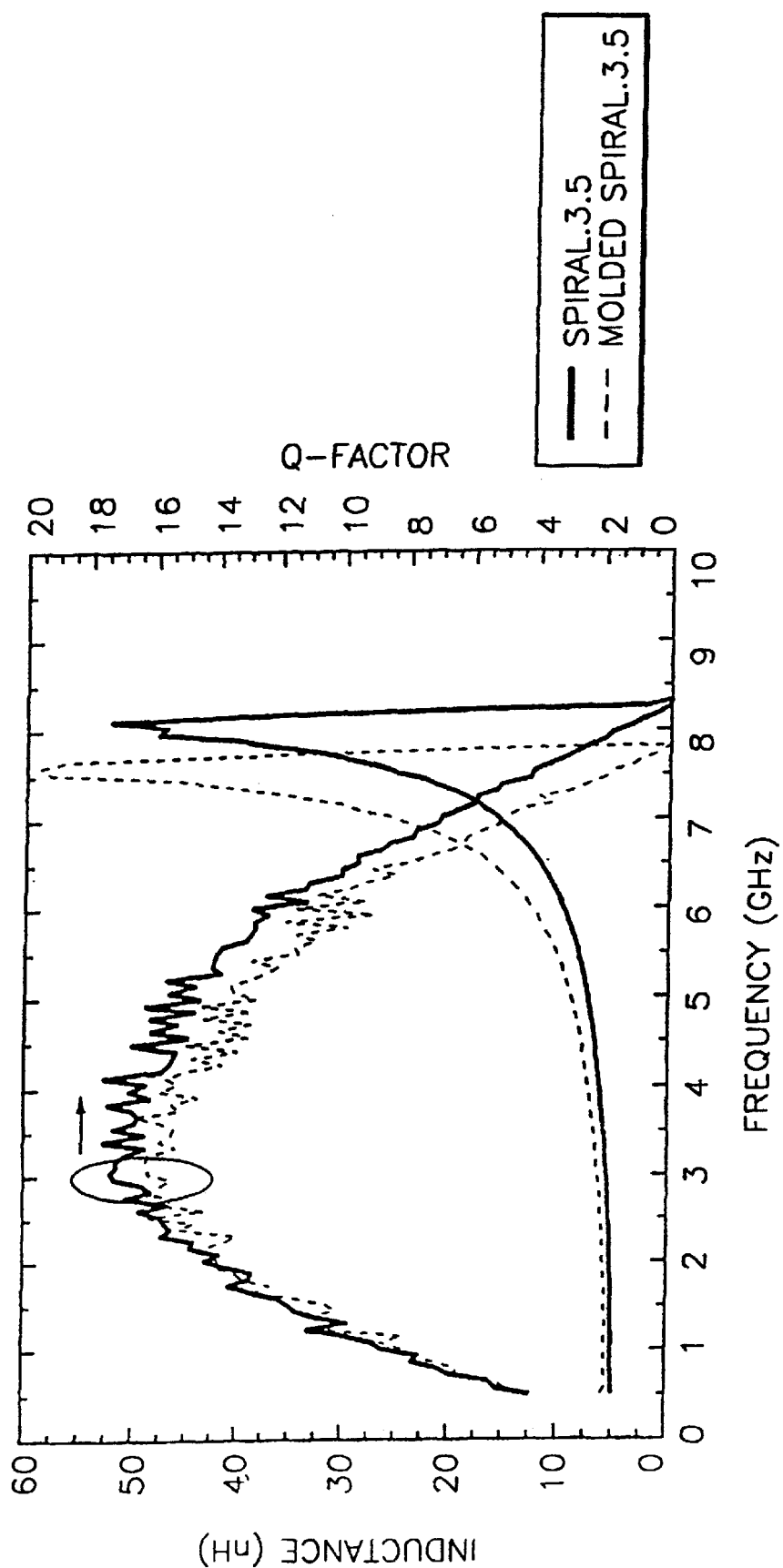
FIG. 15 is a graph of the inductances and the Q-factors of spiral inductors on a GaAs substrate before and after molding.

Embodiment 3
Fabrication of Vertical Bonding Wire Inductors on GaAs Substrate and Test of Characteristics Thereof Vertical bonding wire inductors and spiral inductors were designed and fabricated in the same manner as in Embodiment 1, except that the thickness of the metal strip formed on the GaAs substrate was adjusted to 2 $\mu$m, rather than 0.82 $\mu$m. FIG. 12 comparatively shows the inductances of the fabricated vertical bonding wire inductor and spiral inductor. Referring to FIG. 12, the 3-loop and 4-loop vertical bonding wire inductors have similar inductances to the 2.5-turn and 3.5-turn spiral inductors, respectively. They also have higher resonant frequencies than those of the spiral inductors. FIG. 13 is a graph comparatively showing the Q-factors of the vertical bonding wire inductors and the spiral inductors. As shown in FIG. 13, the 2-loop, 3-loop and 4-loop vertical bonding wire inductors have Q-factors higher than those of the 2.5-turn, 3.5-turn and 4.5-turn spiral inductors. FIGS. 14 and 15 comparatively show the inductances and Q-factors of the 3-loop and 4-loop vertical bonding wire inductors and the 3.5-turn spiral inductor, respectively, before and after molding. It can be seen that the resonant frequency and the Q-factor are decreased after molding in both the vertical bonding wire inductors and the spiral inductor.

TABLE 1

Comparison of measured electrical characteristics of the
vertical bonding wire inductor and spiral inductor on GaAs substrate

| Electrical characteristics | Comparison 1 | | Comparison 2 | |
|---|---|---|---|---|
| | Spiral inductor (2.5 turns) | Vertical bonding wire (2 wire loops) | Spiral inductor (3.5 turns) | Vertical bonding wire (4 wire loops) |
| Inductance at 1 GHz (nH) | 3.5 | 3.5 | 5.1 | 5.3 |
| Resonant frequency (GHz) | 8.6 | 9.2 | 7 | 7.2 |
| Resistance at 1 GHz ($\Omega$) | 6.9 | 2.2 | 9.2 | 3.1 |
| Q-factor ($f_{Qmax}$ (GHz)) | 8.2 (3.2) | 26.5 (3.7) | 7.7 (3) | 23.2 (3) |

Embodiment 4
Fabrication of Vertical Bonding Wire Inductors on Silicon Substrate and Test of Characteristics Thereof Vertical bonding wire inductors and spiral inductors were designed and fabricated in the same manner as in Embodiment 3 except that a p-type silicon substrate (15 $\Omega$-cm) was used instead of the GaAs substrate used in Embodiment 3. The thickness of the metal strip was 2 $\mu$m and the thickness of a $SiO_2$ insulation layer was 2 $\mu$m.

In general, Si substrates have higher conductivities than those of GaAs substrates. In particular, Si substrates used in the semiconductor field are doped with impurities over the entire surface, so that the conductivity is further increased. In the case of using a Si substrate, a thin silicon oxide layer is formed on the substrate prior to the formation of a device, while a device is formed directly on a GaAs substrate. Also, in the aspect of substrate and ohmic losses which affect the Q-factor, the substrate loss in the GaAs substrate is negligible while the ohmic loss therein is considerable. In contrast, the substrate loss in a Si substrate is 3–5 times higher than the conductor loss. Prior to forming a device on a Si substrate, pre-considerations which are different from those for using GaAs substrate, are required.

Figure 16:
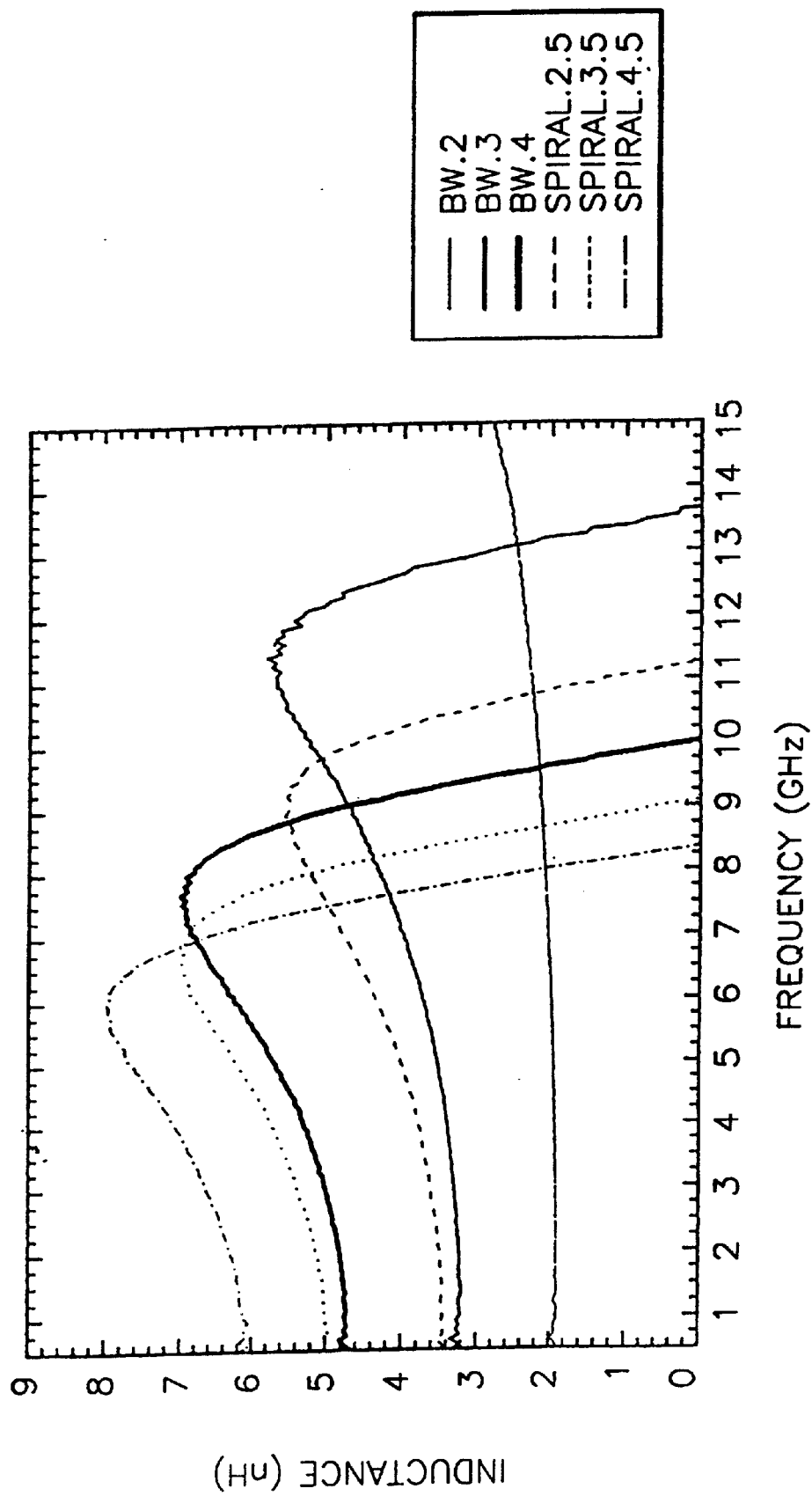
FIG. 16 is a graph of the inductances of vertical bonding wire inductors and spiral inductors on a p-type silicon substrate (15 $\Omega$-cm)
Figure 17:
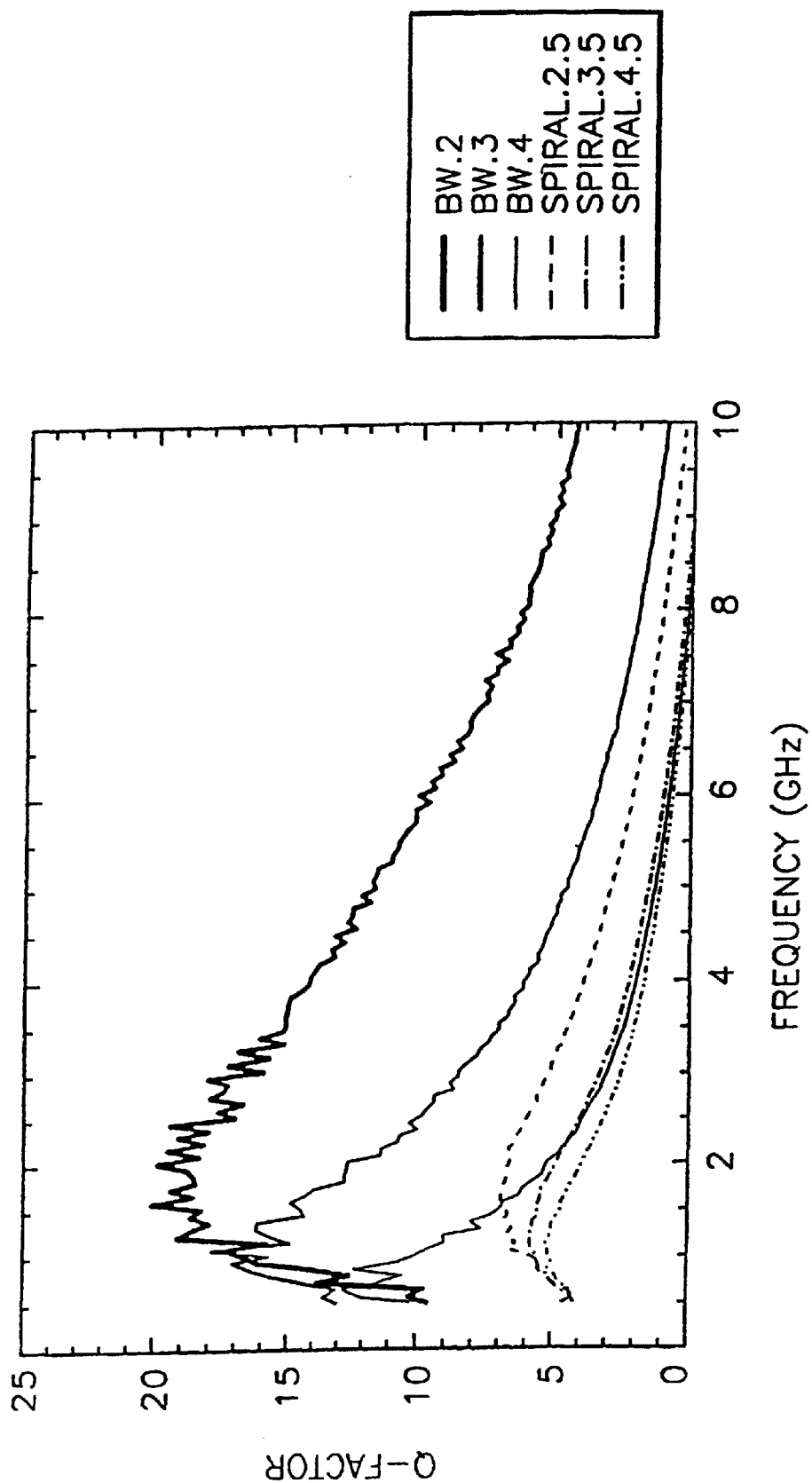
FIG. 17 is a graph of the Q-factors of vertical bonding wire inductors and spiral inductors on a p-type silicon substrate (150 $\Omega$-cm)
Figure 18:
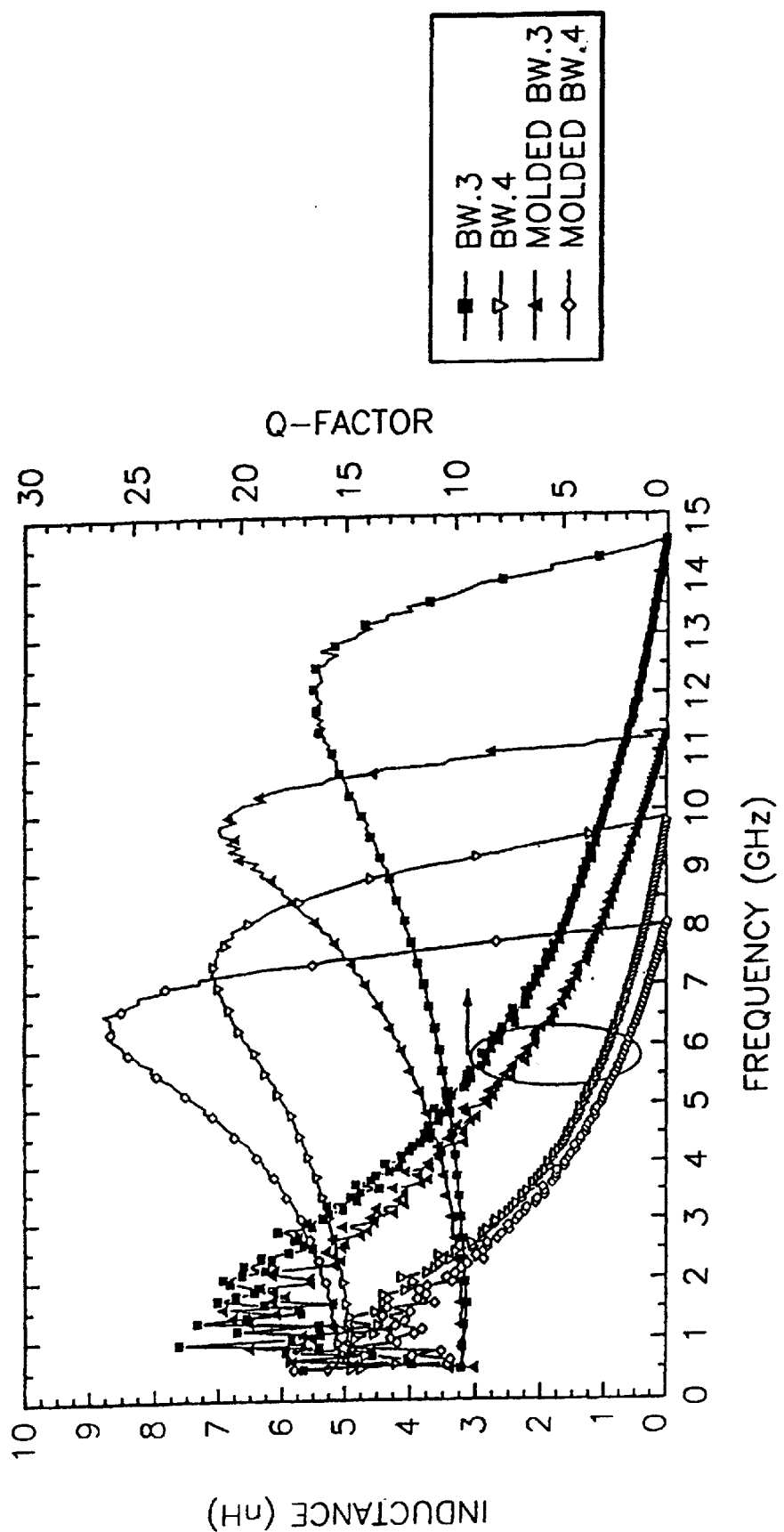
FIG. 18 is a graph of the inductances and the Q-factors of vertical bonding wires on a p-type silicon substrate (15 $\Omega$-cm) before and after molding.
Figure 19:
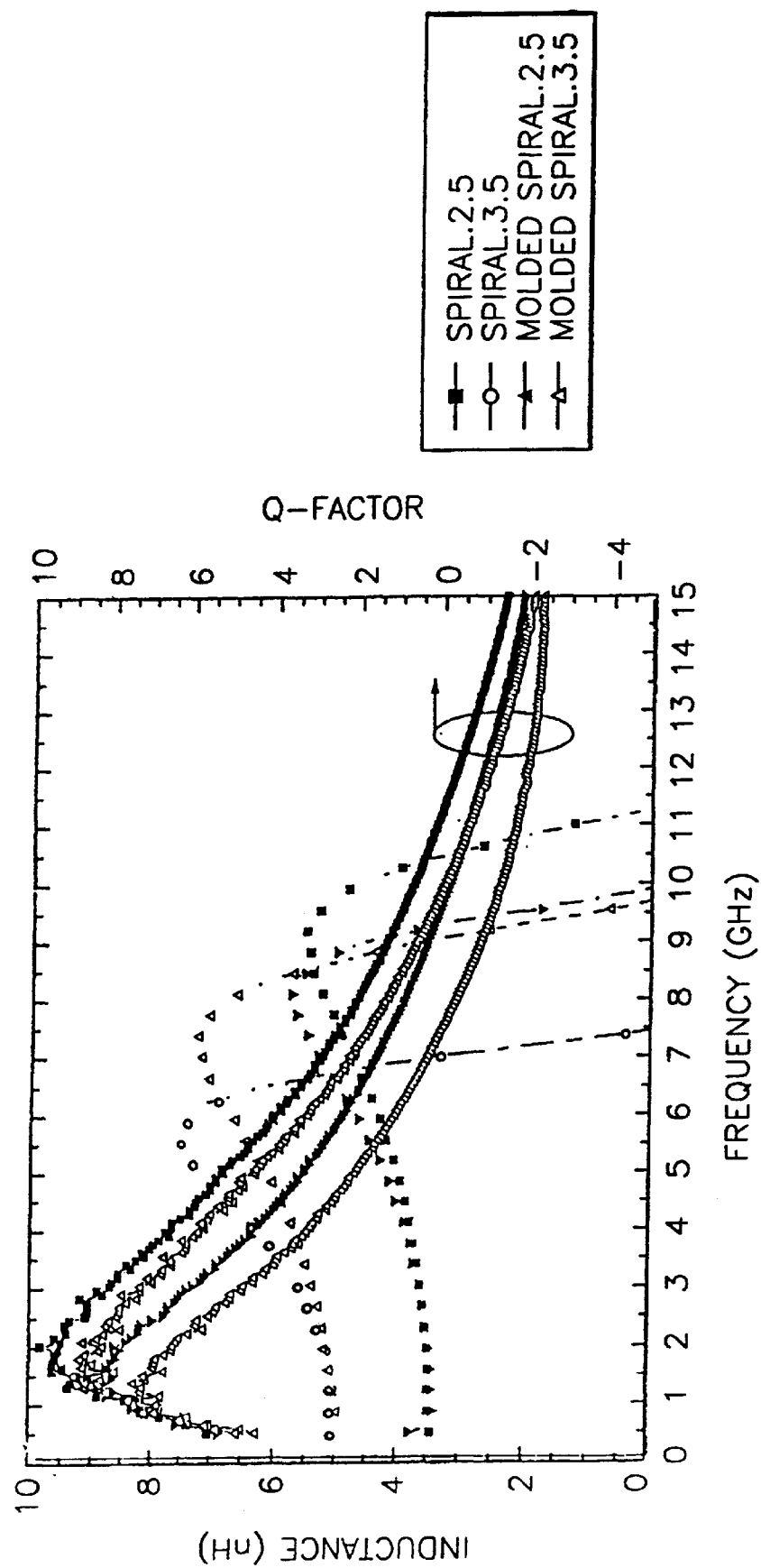
FIG. 19 is a graph of the inductances and the Q-factors of spiral inductors on a p-type silicon substrate (15 $\Omega$-cm) before and after molding.

FIG. 16 is a graph showing the inductances of both the vertical bonding wire inductors and the spiral inductors. As shown in FIG. 16, the inductances of the 3-loop and 4-loop vertical bonding wire inductors are similar to the 2.5-turn and 3.5-turn spiral inductors, respectively. Also, the resonant frequencies of the vertical bonding wire inductors are higher than those of the spiral inductors. FIG. 17 comparatively shows the Q-factors of the vertical bonding wire inductors and the spiral inductors. It can be seen from FIG. 17 that the Q-factors of the 2-loop, 3-loop and 4-loop vertical bonding wire inductors are higher than those of the 2.5-turn, 3.5-turn and 4.5-turn spiral inductors, respectively. FIGS. 18 and 19 comparatively show the inductances and Q-factors of the 3-loop and 4-loop vertical bonding wire inductors and the 2.5-turn and 3.5-turn spiral inductor, respectively, before and after molding. It can be seen that the resonant frequencies and Q-factors of both the vertical bonding wire inductors and the spiral inductors are decreased after molding.

Also, compared with the inductance of the vertical bonding wire inductor formed on a GaAs in Embodiment 3 under similar conditions to this embodiment, shown in FIG. 12, the inductance of the inductor on a Si substrate, manufactured in this embodiment, is not significantly different from that of the inductor formed on the GaAs substrate in Embodiment 3. Comparing the Q factors of the inductors manufactured in this embodiment (FIG. 17) to those in Embodiment 3 (FIG. 13), the Q-factors of the inductors of this embodiment are smaller than those in Embodiment 3. However, the Q-factors of the inductors formed on the Si substrate in this embodiment are much higher than those of conventional spiral inductors. Summing up the results, the vertical bonding wire inductor according to the present invention can be formed in a Si substrate which is favorable to commercial use, providing better characteristics than those of the conventional spiral inductors.

Figure 20:
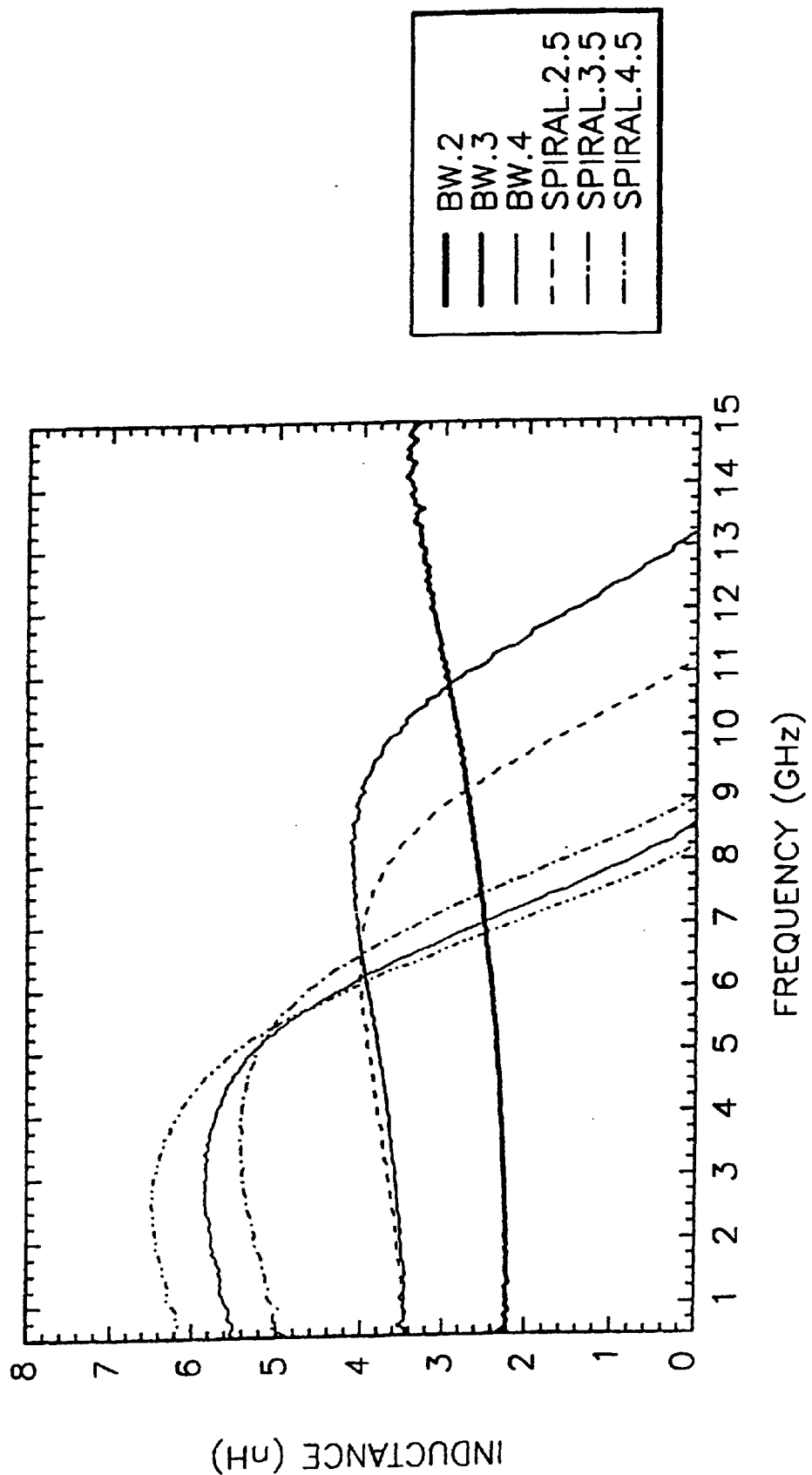
FIG. 20 is a graph of the inductances of vertical bonding wire inductors and spiral inductors on a p-type silicon substrate (30 $\Omega$-cm)
Figure 21:
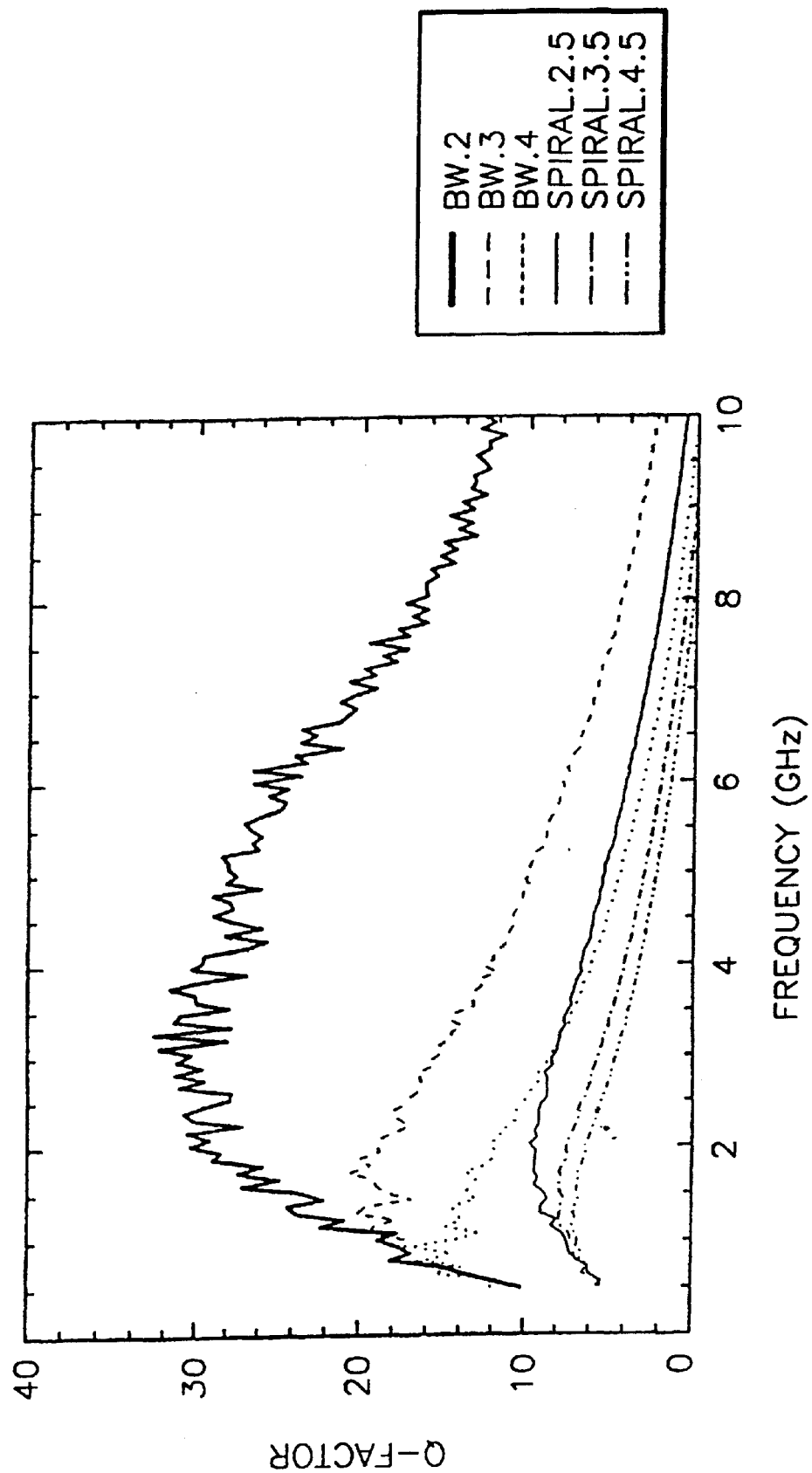
FIG. 21 is a graph of the Q-factors of vertical bonding wire inductors and spiral inductors on a p-type silicon substrate (30 $\Omega$-cm)
Figure 22:
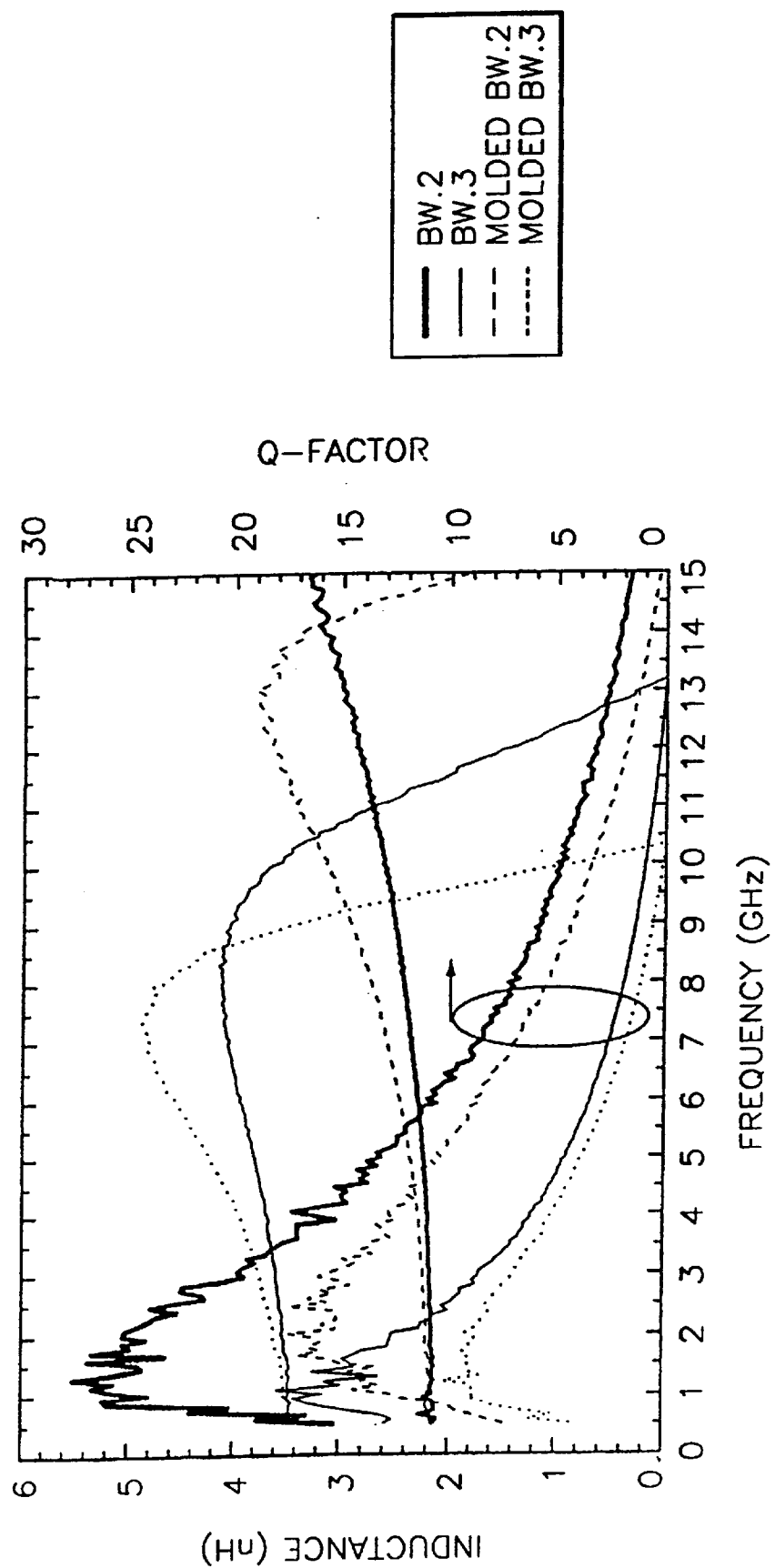
FIG. 22 is a graph of the inductances and the Q-factors of vertical bonding wire inductors on a p-type silicon substrate (30 $\Omega$-cm) before and after molding.
Figure 23:
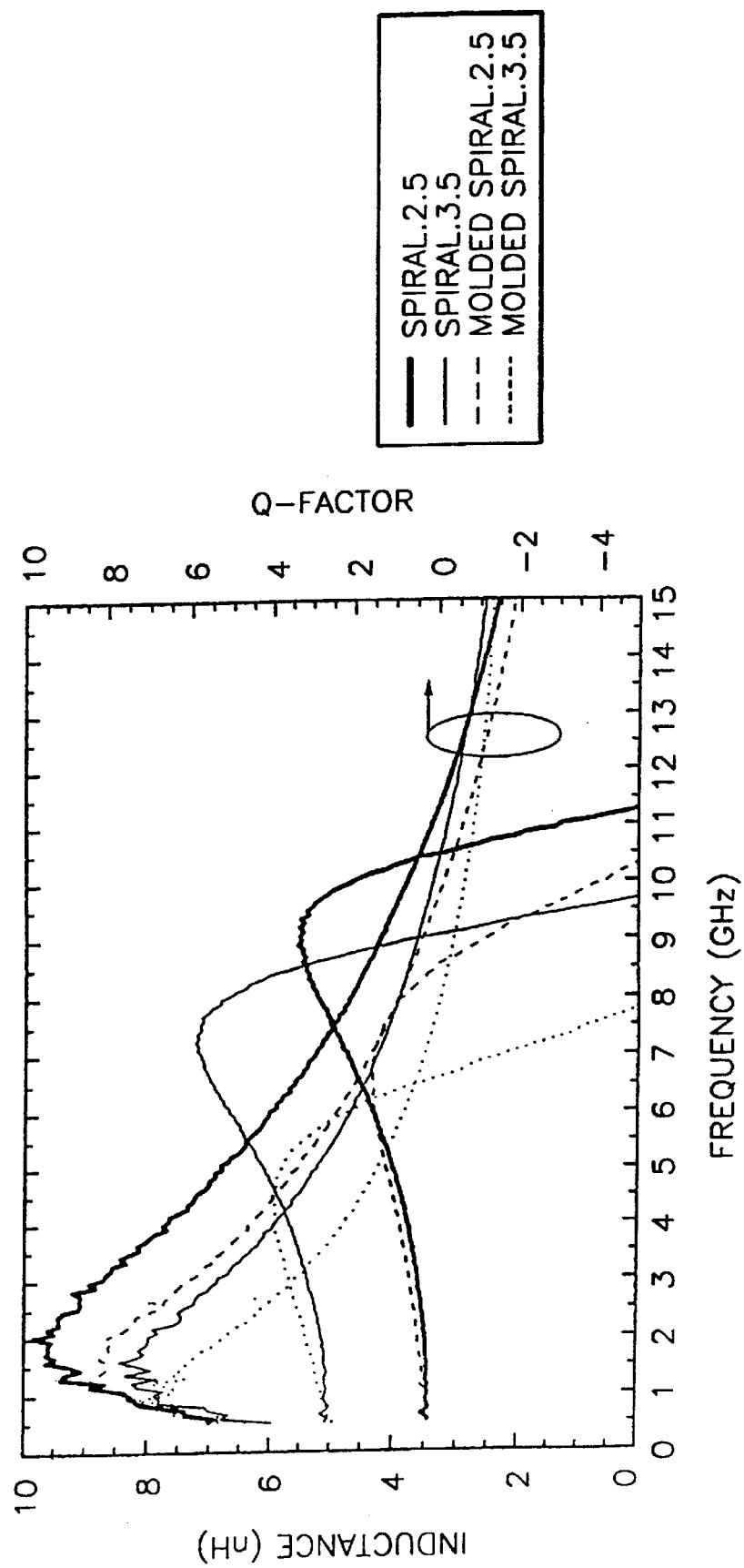
FIG. 23 is a graph of the inductances and the Q-factors of spiral inductors on a p-type silicon substrate (30 $\Omega$-cm) before and after molding.

Embodiment 5
Fabrication of Vertical Bonding Wire Inductors on Silicon Substrate and Test of Characteristics Thereof Vertical bonding wire inductors and spiral inductors were designed and fabricated in the same manner as in Embodiment 4 except that a p-type silicon substrate (30 $\Omega$-cm) was used instead of the p-type silicon substrate (15 $\Omega$-cm) used in Embodiment 4. The thickness of the metal strip was 2 $\mu$m and the thickness of a $SiO_2$ insulation layer was 2 $\mu$m. FIG. 20 is a graph showing the inductances of both the vertical bonding wire inductors and the spiral inductors. As shown in FIG. 20, the inductances and resonant frequencies of the 3-loop and Sloop vertical bonding wire inductors are similar to the 2.5-turn and 3.5-turn spiral inductors, respectively. FIG. 21 comparatively shows the Q-factors of the vertical bonding wire inductors and the spiral inductors. It can be seen from FIG. 21 that the Q-factors of the 2-loop, 3-loop and 4-loop vertical bonding wire inductors are higher than those of the 2.5-turn, 3.5-turn and 4.5-turn spiral inductors, respectively. FIGS. 22 and 23 comparatively show the inductances and Q-factors of the 3-loop and 4-loop vertical bonding wire inductors and the 2.5-turn and 3.5-turn spiral inductor, respectively, before and after molding. It can be seen that the resonant frequencies and Q-factors of both the vertical bonding wire inductors and the spiral inductors are decreased after molding.

For effective comparison between the vertical bonding wire inductors and the spiral inductors, detailed electrical characteristics are tabulated in TABLE 2.

TABLE 2

Comparison of electrical characteristics between vertical bonding wire inductors and spiral inductors on p-type silicon substrate (30 $\Omega$-cm)

| Electrical characteristics | Vertical bonding wire inductor (Si—P type 30 $\Omega$-cm) | | | Spiral inductor |
|---|---|---|---|---|
| | 105 $\mu$m-pad pitch | 100 $\mu$m-pad pitch | 85 $\mu$m-pad pitch | |
| Inductance at 500 MHz (nH) | | | | |
| 2 loops | 2 | 2 | 2.1 | — |
| 3 loops | 3.2 | 3.3 | 3.5 | 3.5 (2.5 turns) |
| 4 loops | 4.7 | 4.8 | 5 | 5 (3.5 turns) |
| $Q_{max}$ | | | | |
| 2 loops | 30 (3 GHz) | 32 (3 GHz) | 34 (3 GHz) | — |
| 3 loops | 18 (1.8 GHz) | 20 (1.8 GHz) | 22 (1.8 GHz) | 8 (1.5 GHz) (2.5 turns) |
| 4 loops | 14 (1 GHz) | 15 (1 GHz) | 16 (1 GHz) | 7 (1.2 GHz) (3.5 turns) |

TABLE 2-continued

Comparison of electrical characteristics between vertical bonding wire inductors and spiral inductors on p-type silicon substrate (30 Ω-cm)

| Electrical characteristics | Vertical bonding wire inductor (Si—P type 30 Ω-cm) | | | Spiral inductor |
|---|---|---|---|---|
| | 105 μm-pad pitch | 100 μm-pad pitch | 85 μm-pad pitch | |
| Q-factor at 3 GHz | | | | |
| 2 loops | 30 | 32 | 34 | — |
| 3 loops | 14 | 16 | 18 | 5.5 (2.5 turns) |
| 4 loops | 7 | 9 | 10 | 4.5 (3.5 turns) |
| Resonant frequency (GHz) | | | | |
| 2 loops | >15 | >15 | >15 | — |
| 3 loops | 13 | 13.5 | 14 | 11 (2.5 turns) |
| 4 loops | 9.5 | 10 | 11 | 9.5 (3.5 turns) |

From TABLE 2, it can be seen that the Q-factors and the resonant frequencies of the vertical bonding wire inductors according to the present invention are much higher than those of the spiral inductors. Also, the inductances of the 3-loop and 4-loop bonding wire inductors are nearly equal to those of the 2.5-turn and 3.5-turn spiral inductors, respectively.

Embodiment 6

Fabrication of Vertical Bonding Wire Inductor Having Bonding Pads Connected by Only Bonding Wires and Test of Characteristics Thereof Vertical bonding wire inductors were fabricated in the same manner as in the preceding embodiments, except that the bonding pads were diagonally connected by stitch bonding wires instead of metal strips. By using automatic stitch bonding machine having a rotary head, the bonding pads on the GaAs or silicon substrate were diagonally connected, resulting in the stitch bonding wires which have a low bonding height (about 100 μm) compared to the case of using the metal strips. As a result, as shown in FIGS. 24A and 24B, another vertical bonding wire inductor according to the present invention, which comprises only bonding wires, having a trapezoidal loop shape, was formed. The resistance of the vertical bonding wire inductor including only the bonding wires is lower than those of the vertical bonding wire inductors manufactured in the preceding embodiments, so that the Q-factor thereof is greatly increased. Also, the parasitic capacitance of the vertical bonding wire inductor of this embodiment is lower than that of the vertical bonding wire inductor having the metal strips, thereby significantly increasing the resonance frequency. Also, the process for forming metal strips, performed in the preceding embodiments, is not performed, so that the manufacturing process can be further simplified.

Figure 25A:
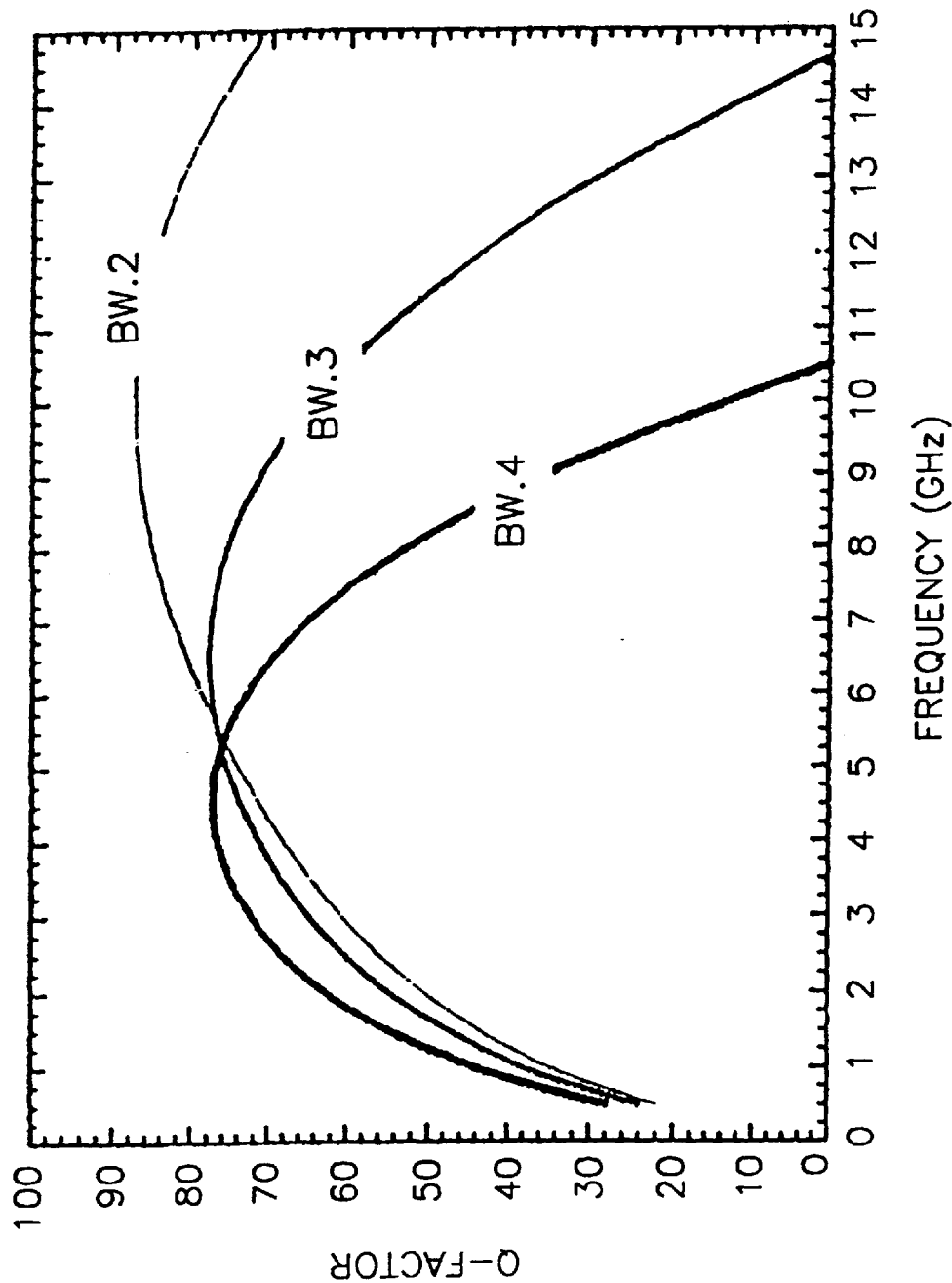
FIG. 25A is a graph of the Q-factors of the vertical bonding wire inductors of FIG. 24A.

The resistance of the vertical bonding wire inductor of this embodiment was calculated from measured resistance of a single bonding wire by using the Phenomenological loss equivalence method [H. Y. Lee and T. Itho, 1989, *Phenomenological loss equivalence method for planar quassi-TEM transmission lines with a thin normal conductor or superconductor*, IEEE Trans. Microwave Theory and Tech., Vol. MTT-37, No. 12, pp. 1904–1909]. As a result, the loop area was reduced by the stitch bonding, so that the inductance of the inductor was decreased by about 10% and the parasitic capacitance was decreased by about 34%. FIG. 25A shows the Q-factors of the vertical bonding wire inductors with respect to the frequency. As shown in FIG. 25A, the Q-factors are greatly improved at low frequencies. At a frequency lower than 5 GHz, the Q-factor of the Sloop bonding wire inductor was higher than those of the 2-loop and 3-loop bonding wire inductors, because an increase in the magnetic flux linkage is more prominent than that in the resistance for an increase in the number of loops. As described above, because the parasitic capacitance due to the metal strips is not produced, a decrease in the Q-factor due to resonance does not occur at frequencies lower than 5 GHz. The maximum Q-factor and usable frequency range of the vertical bonding wire inductors of this embodiment are similar to those of the off-chip inductor. In addition, because the parasitic factors are not present, which are caused by external interconnection lines in the off-chip inductor, the vertical bonding wire inductor of this embodiment shows significantly more efficient characteristics.

Embodiment 7

Figure 24C:
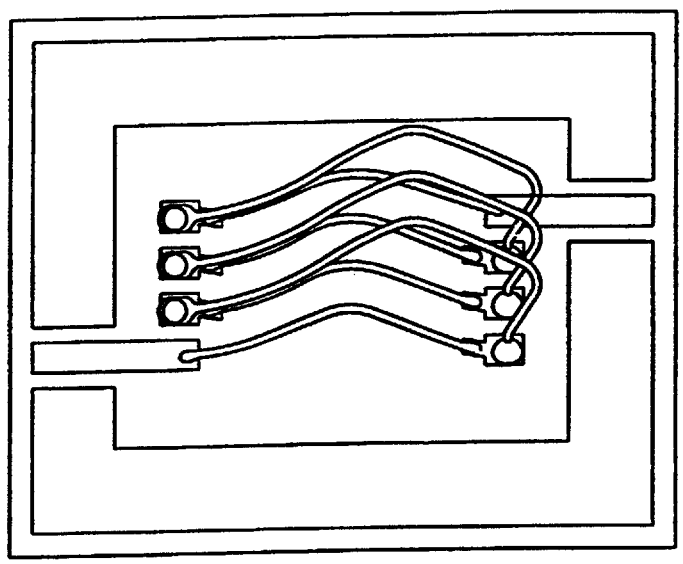
FIGS. 24C and 24D shows another vertical bonding wire inductor on a silicon substrate (15 $\Omega$-cm)

Fabrication of Vertical Bonding Wire Inductor Having Bonding Pads Connected by Only Bonding Wires and Test of Characteristics Thereof The bonding wire inductor shown in FIG. 24C was fabricated as another embodiment of the present invention. This bonding wire inductor the same as the bonding wire inductor shown in FIG. 24B, fabricated in Embodiment 6, in that all connection between bonding pads was achieved by bonding wires. However, in the bonding with inductor of FIG. 24C, a silicon substrate (15 Ω-cm) having a 2 μm-thick SiO$_2$ insulating layer was used and the connection of facing bonding pads in a parallel direction was achieved with bonding wires by stitch bonding, while the connection of the bonding pads in a diagonal direction was achieved with bonding wires by ball bonding, which is the difference from the bonding wire inductor of FIG. 24B. Each inductor loop included two bonding pads and upper and lower bonding wires. The upper and lower bonding wires were made of gold (Au) having a diameter of 33 μm. Also, the average heights of upper loops formed by the upper bonding wires, and the lower loops formed by the lower bonding wires, were 500 μm and 50 μm, respectively and the loop pitch was 85 μm. The bonding wires connect the bonding pads each of 80×80 μm, and occupy the area of 400×770 μm. The thickness of the silicon substrate was 500 μm and a 2 μm-thick SiO$_2$ insulating layer was formed thereon. The metal pattern was formed by deposition of Au(0.8 μm)/Cr (200 Å) and by the lift-off process. As a result, another vertical bonding wire inductor having a trapezoidal loop shape was formed, as shown in FIG. 24C. The S-parameters of the inductor were measured by a vector network analyzer and a microwave probe station in the frequency range of 0.5–20 GHz. The parasitic capacitance of a probe pad was effectively de-embedded using the S-parameters according to the open coplanar waveguide standard.

Figure 25B:
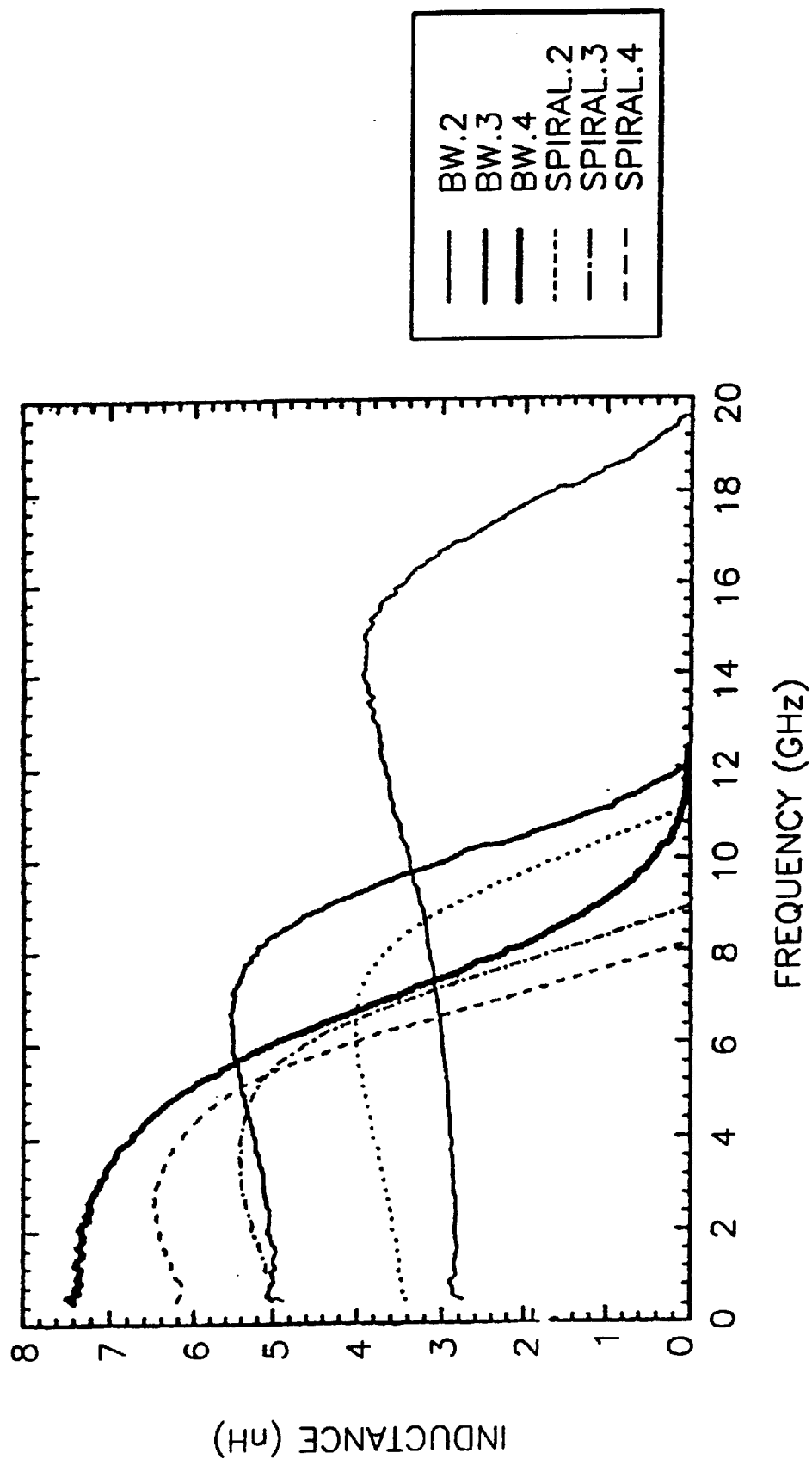
FIG. 25B is a graph of the inductances of the vertical bonding wire inductors of FIG. 24C and spiral inductors.

FIG. 25B comparatively shows the inductances of the vertical bonding wire inductors of this embodiment and the spiral inductors. As shown in FIG. 25B, as the number of loops increases, the inductances of the bonding wire inductors increase while the resonant frequencies decrease. The result can also be obtained with an increase in the number of turns of the spiral inductor. The inductance of the 3-loop bonding wire inductor is nearly equal to that of the 3-turn spiral inductor, and the resonant frequency thereof is slightly higher than that of the 3-turn spiral inductor.

Figure 25C:
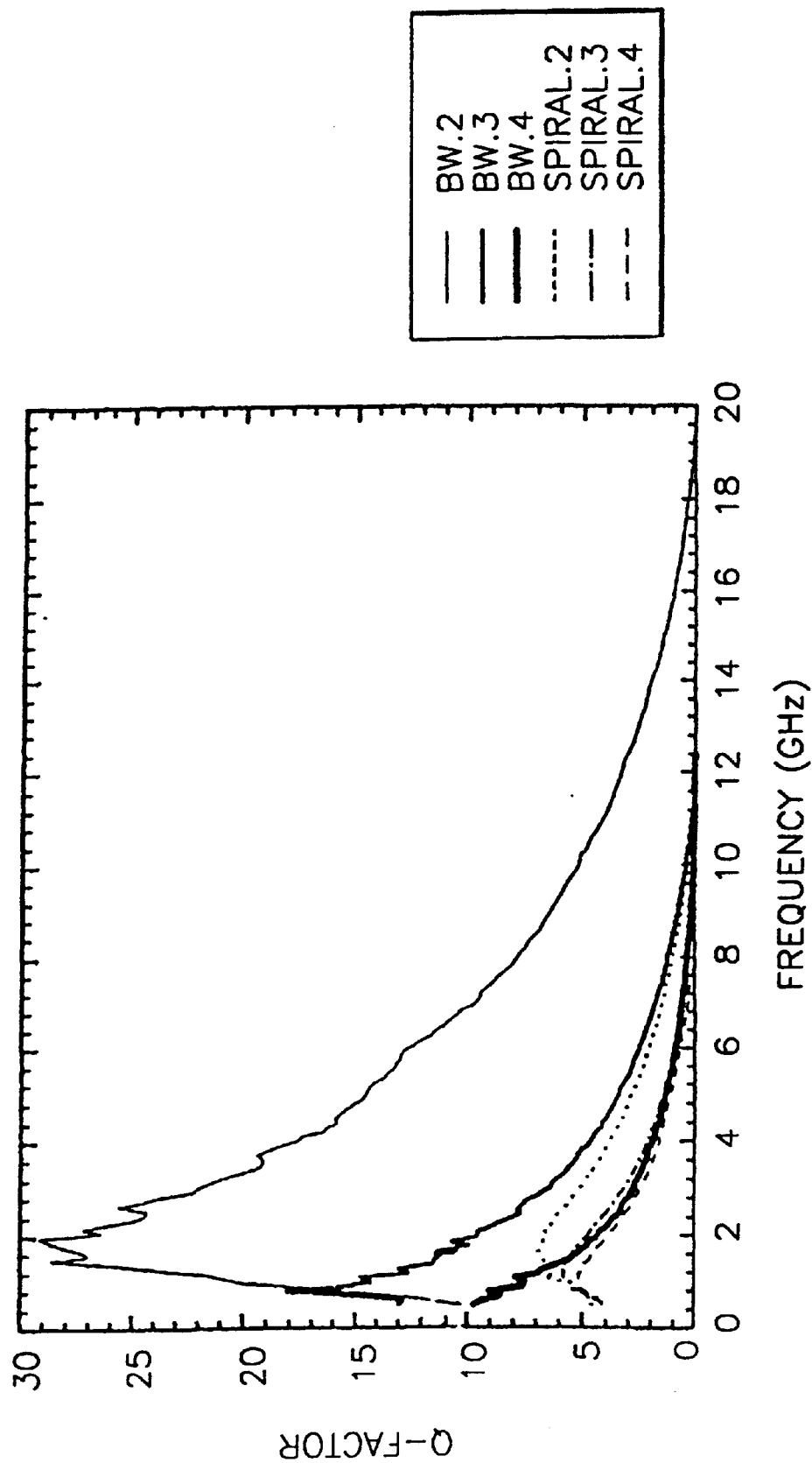
FIG. 25C is a graph of the Q-factors of the vertical bonding wire inductor of FIG. 24C and the spiral inductors.

FIG. 25C shows the Q-factors of the vertical bonding wire inductors of this embodiment and the spiral inductors. As shown in FIG. 25C, the Q-factors of the bonding wire conductors are much higher than those of the spiral inductors. This is due to a low ohmic loss of the vertical bonding wire inductors and a low substrate loss by arranging the bonding wire inductor perpendicular to the silicon substrate.

For effective comparison between the vertical bonding wire inductors and the spiral inductors on the silicon substrate (15 Ω-cm), the electrical characteristics thereof are tabulated in TABLE 3.

The resonant frequency and the Q-factor of the 3-loop bonding wire inductor of this embodiment are increased by about 3 GHz and 300%, respectively.

Figure 24D:
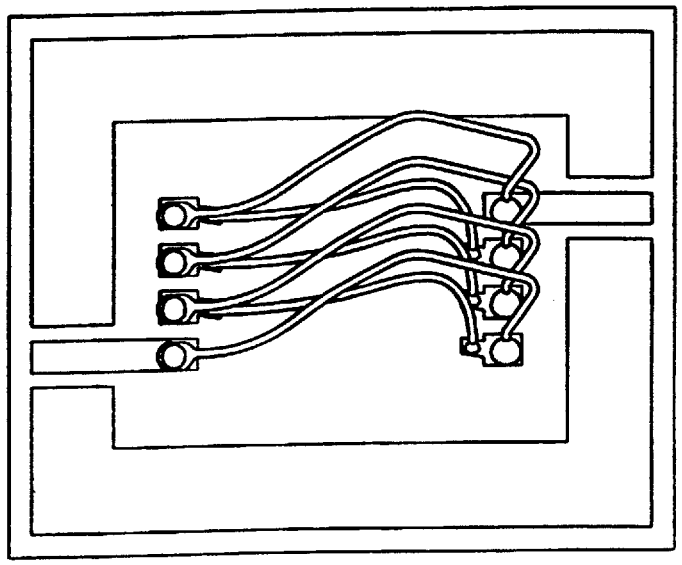

Embodiment 8
Fabrication of Vertical Bonding Wire Inductor Having Bonding Pads Connected by Only Bonding Wires and Test of Characteristics Thereof The bonding wire inductor shown in FIG. 24D was fabricated as yet another embodiment of the present invention. This bonding wire inductor is the same as the bonding wire inductor shown in FIGS. 24B and 24C, fabricated in Embodiments 6 and 7, in that all connection between bonding pads was achieved by bonding wires. However, unlike the bonding wire inductors of FIGS. 24B and 24C, the connection of the bonding pads in both parallel and diagonal directions was achieved by ball bonding. As a result, another vertical bonding wire inductor having a trapezoidal loop shape was obtained, as shown in FIG. 24D. The electrical characteristics of the bonding wire inductors according to the present invention, such as inductance and Q-factor, were similar to those in Embodiment 7.

TABLE 3

Comparison of electrical characteristics between vertical bonding wire inductors and spiral inductors on silicon substrate (15 Ω-cm)

| Electrical characteristics | 2 turns or loops | | 3 turns or loops | | 4 turns or loops | |
|---|---|---|---|---|---|---|
| | Spiral | Bonding wire | Spiral | Bonding wire | Spiral | Bonding wire |
| Inductance at 1 GHz (nH) | 3.4 | 2.8 | 5 | 4.9 | 6.2 | 7.4 |
| Resonant frequency (GHz) | 11.2 | 19.6 | 9 | 12 | 8.2 | 11.6 |
| Q-factor ($f_{Qmax}$ (GHz)) | 7 (1.8) | 29 (2) | 6 (1.2) | 18 (0.8) | 5 (1.1) | 9.9 (0.5) |

Figure 26:
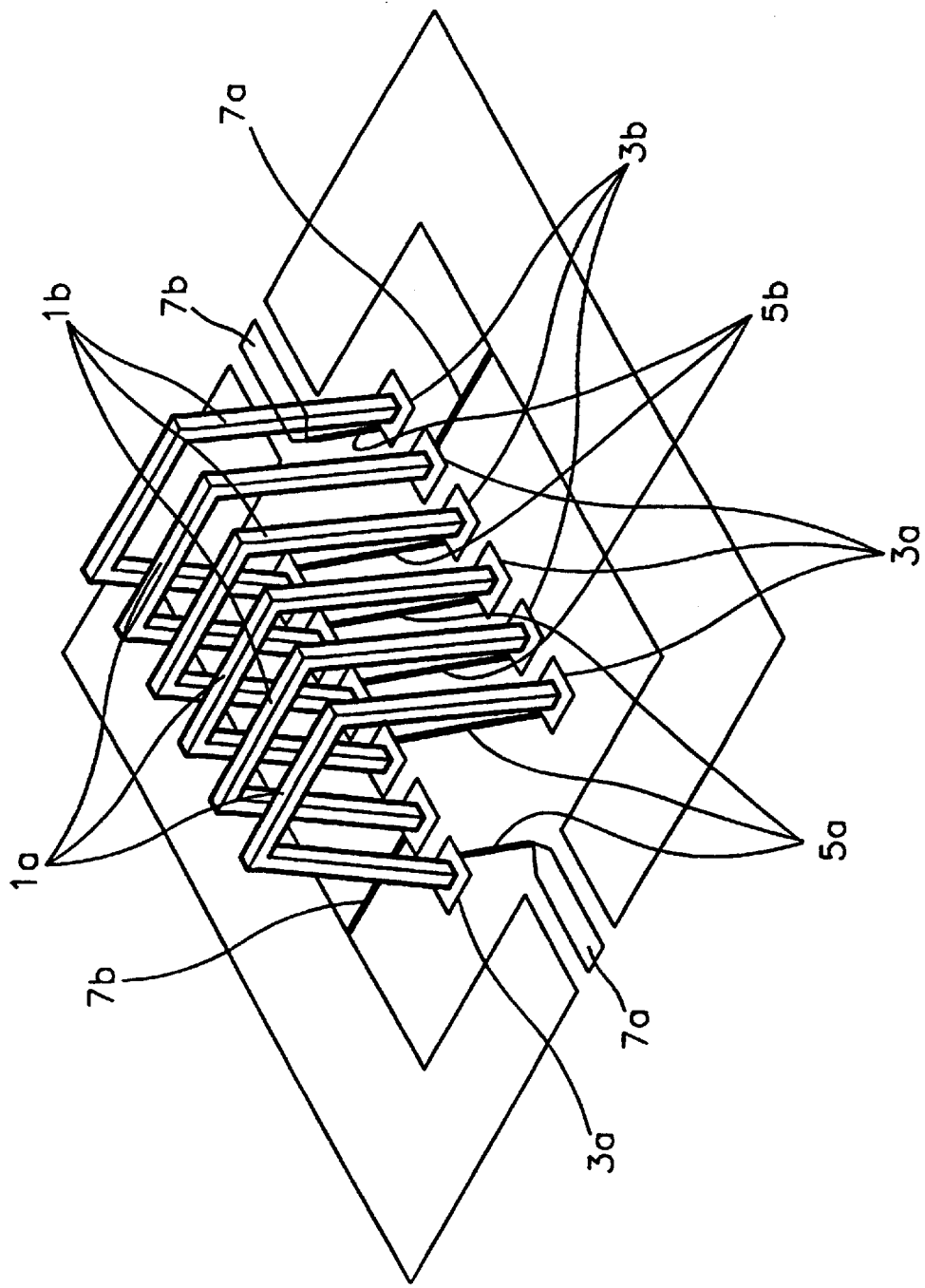
FIGS. 26 and 27 shows examples of arrangement in which two bonding wire inductors according to the present invention are arranged being adjacent to, each other.
Figure 27:
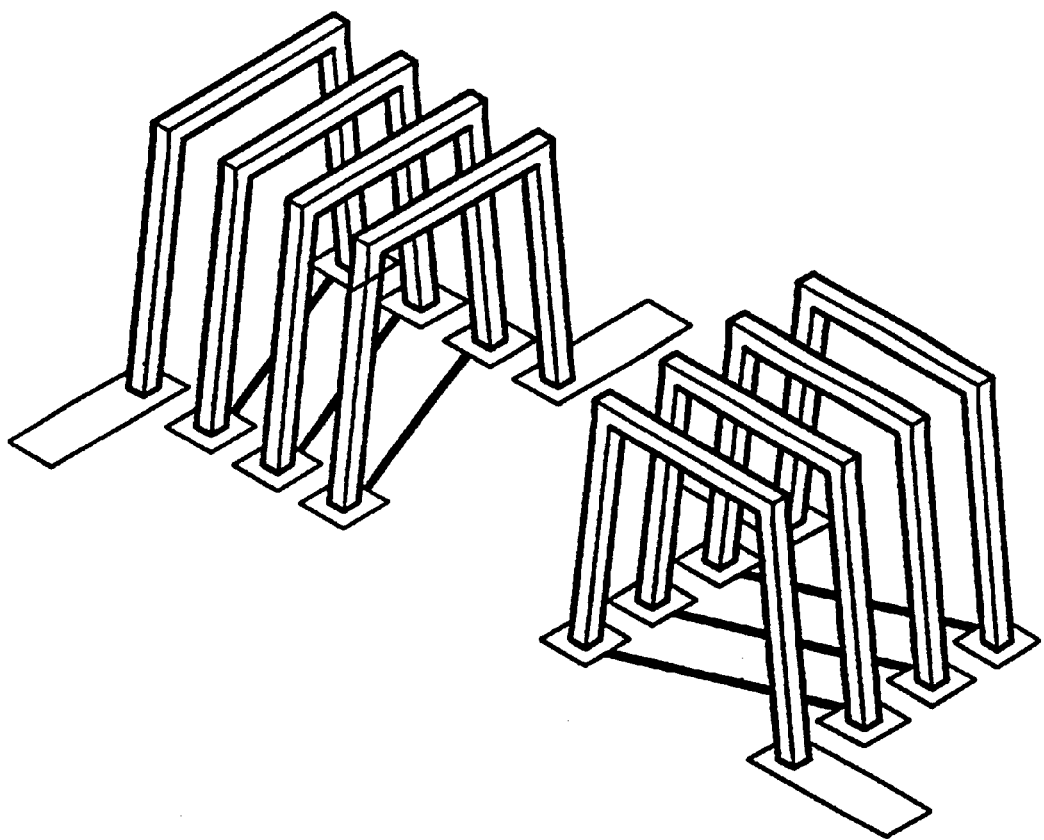

The bonding wire inductor according to the present invention can be used in couplers, transformers or other radio frequency devices, wherein two bonding wire inductors are arranged in each device. That is, as shown in FIG. 26, one bonding wire inductor including bonding wires 1a, bonding pads 3a, metal strips 5a and input/output ports 7a, and the other bonding wire inductor including bonding wires 1b, bonding pads 3b, metal strips 5b and input/output ports 7b, may be arranged such that they overlap each other, for use in a coupler or transformer. In such a case, where two or more bonding wire inductors are arranged such that they are adjacent to each other, it is more effective to arrange the bonding wire inductors such that the direction of the magnetic fields thereof are perpendicular to each other as shown in FIG. 27, thereby minimizing magnetic interference. Also, in the bonding wire inductors of FIGS. 26 and 27, the metal strips were used for the connection between the bonding pads in a diagonal direction. However, the metal strips can be replaced by stitch bonding wires or ball bonding wires as shown in FIGS. 24A through 24D.

As described above, according to the results of simulation in which the electrical characteristics of the bonding wire inductor were analyzed by varying the frequency range to 10 GHz, the inductance of the bonding wire inductor was improved by about 6%, and the resonant frequency and the Q-factor thereof were also improved by about 8.5% and 360%, respectively, compared to the spiral inductor having the same area under the same environment. Also, the resonant frequency and Q-factor of the vertical bonding wire inductors according to the present invention, formed on the GaAs substrate and silicon substrate, were improved compared to the spiral inductors. In particular, the Q-factor and the resonant frequency of the vertical bonding wire inductors including bonding pads connected by only bonding wires are much higher than those of the vertical bonding wire inductor in which a metal strip is used for the connection. Thus, such bonding wire inductors, which use only bonding wires for the connection are more effective for practical use.

INDUSTRIAL APPLICABILITY

Also, the method for manufacturing an inductor for RFICs or MMICs according to the present invention does not require an air bridge process for the connection at the center of the inductor as does a conventional method for manufacturing a spiral inductor, which has a problem, thus additional photolithography and metallization processes are not required, thereby simplifying the overall process in addition to reducing the manufacturing cost. Due to the improved electrical characteristics, stability in process, tunability without additional mask manufacturing processes, and relatively low manufacturing cost, the vertical bonding wire inductor according to the present invention can be useful in production of economical microwave devices.

What is claimed is:

1. A bonding wire inductor comprising:

a first inductor terminal and a second inductor terminal formed on a substrate having a main surface;

a first bonding pad connected to the first inductor terminal;

a second bonding pad connected to the second inductor terminal;

a first bonding wire connected between the first and second bonding pads; said first bonding wire including a first member bonded to the first bonding pad, a second member coupled to the first member and rising from the main surface of the substrate in a direction opposing to the second bonding pad; a third member coupled to the second member and rising up to a wire loop height in a direction toward the second bonding pad, and a fourth member coupled to the third member and descending toward the second bonding pad to be bonded to the second bonding pad; and said wire loop height ranging from 100 μm to 1,000 μm.

2. The bonding wire inductor of claim 1, wherein the bonding wire inductor is fixed by magnetic material inserted into the bonding wires.

3. The bonding wire inductor of claim 1, further comprising a third bonding pad and a fourth bonding pad connected between the second inductor terminal and the second bonding pad, and at least one second bonding wire connected between the third and fourth bonding pads, and wherein:

said second bonding wire includes a first member bonded to the third bonding pad, a second member coupled to the first member and rising from the main surface of the substrate in a direction opposing to the fourth bonding pad; a third member coupled to the second member and rising up to a wire loop height in a direction toward the fourth bonding pad, and a fourth member coupled to the third member and descending toward the fourth bonding pad to be bonded to the fourth bonding pad;

said wire loop height ranging from 100 $\mu$m to 1,000 $\mu$m; and said second and third boding pads are electrically interconnected by a metal strip line.

4. The bonding wire inductor of claim 3, wherein the second bonding wire is ball bonded to one of the third and fourth bonding pads and is wedge bonded to the other one of the third and fourth bonding pads.

5. The bonding wire inductor of claim 1, wherein the first bonding wire is ball bonded to one of the first and second bonding pads and is wedge bonded to the other one of the first and second bonding pads.

6. The bonding wire inductor of claim 1, wherein the substrate is a gallium arsenide (GaAs) substrate, a silicon substrate, an alumina substrate, a fluorineresin substrate, an epoxy substrate, a ceramic substrate, a silicon-on-insulator (SOI) substrate, a lithium tantalite (LiTaO$_3$) substrate, a lithium niobate (LiNbO$_3$) substrate, a low temperature co-fired ceramic (LTCC) substrate, a quartz substrate, a glass substrate or a printed circuit board.

7. A chip inductor formed by individually packaging the bonding wire inductor of claim 1.

8. A coupler formed by arranging two bonding wire inductors of claim 1 adjacent to one another.

9. A transformer formed by arranging two bonding wire inductors of claim 1 adjacent to one another.

10. A bonding wire inductor comprising:
a first inductor terminal and a second inductor terminal formed on a substrate having a main surface;
a first bonding pad connected to the first inductor terminal;
a second bonding pad connected to the second inductor terminal;
a first main bonding wire connected between the first bonding pad and a third bonding pad;
a second main bonding wire connected between the second bonding pad and a fourth bonding pad;
a sub bonding wire connected between the third bonding pad and the fourth bonding pad;
said first main bonding wire including a first member bonded to the first bonding pad, a second member coupled to the first member and rising from the main surface of the substrate in a direction opposing to the third bonding pad; a third member coupled to the second member and rising up to a wire loop height in a direction toward the third bonding pad, and a fourth member coupled to the third member and descending toward the third bonding pad to be bonded to the third bonding pad;

said second main bonding wire including a first member bonded to the fourth bonding pad, a second member coupled to the first member and rising from the main surface of the substrate in a direction opposing to the second bonding pad; a third member coupled to the second member and rising up to a wire loop height in a direction toward the second bonding pad, and a fourth member coupled to the third member and descending toward the second bonding pad to be bonded to the second bonding pad;

said wire loop height of the first and second main bonding wires ranged from 100 $\mu$ to 1,000 $\mu$m; and said sub bonding wire electrically interconnecting the third and fourth boding pads in place of a metal strip line.

11. The bonding wire inductor of claim 10, wherein the sub bonding wire is wedge bonded to both the third and fourth bonding pads.

12. The bonding wire inductor of claim 10, wherein the sub bonding wire is ball bonded to one of the third and fourth bonding pads and is wedge bonded to the other one of the third and fourth bonding pads.

13. The bonding wire inductor of claim 10, wherein the bonding wire inductor is fixed by magnetic material inserted into the bonding wires.

14. The bonding wire inductor of claim 10, wherein the substrate is a gallium arsenide (GaAs) substrate, a silicon substrate, an alumina substrate, a fluorineresin substrate, an epoxy substrate, a ceramic substrate, a silicon-on-insulator (SOI) substrate, a lithium tantalite (LiTaO$_3$) substrate, a lithium niobate (LiNbO$_3$) substrate, a low temperature co-fired ceramic (LTCC) substrate, a quartz substrate, a glass substrate or a printed circuit board.

15. A chip inductor formed by individually packaging the bonding wire inductor of claim 10.

16. A coupler formed by arranging two bonding wire inductors of claim 10 adjacent to one another.

17. A transformer formed by arranging two bonding wire inductors of claim 10 adjacent to one another.

* * * * *